(12) United States Patent
Carrilero et al.

(10) Patent No.: US 9,023,457 B2
(45) Date of Patent: May 5, 2015

(54) TEXTURED SURFACES AND METHODS OF MAKING AND USING SAME

(71) Applicants: Corning Incorporated, Corning, NY (US); ICFO (The Institute of Photonic Sciences), Barcelona (ES); ICREA (Institute Catalana de Recerca I Estudis Avancats), Barcelona (ES)

(72) Inventors: Albert Carrilero, Cardedeu (ES); Prantik Mazumder, Ithaca, NY (US); Johann Osmond, Barcelona (ES); Valerio Pruneri, Barcelona (ES); Paul Arthur Sachenik, Corning, NY (US); Lili Tian, Laurel, MD (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/687,227

(22) Filed: Nov. 28, 2012

(65) Prior Publication Data

US 2013/0157007 A1 Jun. 20, 2013

Related U.S. Application Data

(60) Provisional application No. 61/565,188, filed on Nov. 30, 2011.

(51) Int. Cl.
 *C23F 1/02* (2006.01)
 *G03F 7/00* (2006.01)
 *B08B 17/06* (2006.01)

(52) U.S. Cl.
 CPC ... *C23F 1/02* (2013.01); *G03F 7/00* (2013.01); *B08B 17/065* (2013.01); *Y10S 977/773* (2013.01); *Y10S 977/89* (2013.01)

(58) Field of Classification Search
 CPC ............ B08B 17/065; C23F 1/02; G03F 7/00
 USPC .............. 428/141, 156, 172, 173, 195.1, 113, 428/138, 142, 143, 209, 212, 608, 207, 337, 428/201, 215, 216, 217, 220, 317.1, 317.7, 428/317.9, 332, 336, 339, 343, 36.2, 400, 428/426, 428, 447, 450, 457, 548, 67; 359/267, 871, 290, 507, 580; 977/773, 977/700, 902, 904, 755; 216/41, 22, 52, 66
 See application file for complete search history.

(56) References Cited

U.S. PATENT DOCUMENTS

2004/0067339 A1 4/2004 Gandon et al. ............... 428/141
2007/0148815 A1* 6/2007 Chao et al. .................... 438/104

(Continued)

FOREIGN PATENT DOCUMENTS

WO 2008036074 A3 3/2008
WO 2010017503 A1 2/2010
WO 2010022107 A2 2/2010

OTHER PUBLICATIONS

Yong-Bum Park et al, "Superhydrophobic Cylindrical Nanoshell Array", May 4, 2010, Langmuir 2010, 26(11), 7661-7664.*

(Continued)

*Primary Examiner* — Aaron Austin
*Assistant Examiner* — Jasper Saberi
(74) *Attorney, Agent, or Firm* — Timothy M. Schaeberle; Payal A. Patel

(57) ABSTRACT

Described herein are various methods for making textured articles, textured articles that have improved fingerprint resistance, and methods of using the textured articles. The methods generally make use of masks comprising nanostructured metal-containing features to produce textured surfaces that also comprise nanostructured features. These nanostructured features in the textured surfaces can render the surfaces hydrophobic and oleophobic, thereby beneficially providing the articles with improved fingerprint resistance relative to similar or identical articles that lack the texturing.

19 Claims, 16 Drawing Sheets

Step 1: Deposit CUTMF on substrate

Step 2: Dewet CUTMF to create mask

Step 3: Oxidize the mask

(56) References Cited

U.S. PATENT DOCUMENTS

| | | | |
|---|---|---|---|
| 2008/0206550 A1 | 8/2008 | Borlner | 428/323 |
| 2009/0014416 A1 | 1/2009 | Gandon et al. | 216/67 |
| 2010/0028604 A1 | 2/2010 | Bhushan et al. | 428/156 |
| 2010/0098909 A1* | 4/2010 | Reyssat et al. | 428/141 |
| 2010/0209673 A1 | 8/2010 | Viasnoff et al. | 428/172 |
| 2010/0285275 A1* | 11/2010 | Baca et al. | 428/141 |
| 2011/0114226 A1 | 5/2011 | Pruneri et al. | 148/284 |

OTHER PUBLICATIONS

Bahadur et al, "Preventing the Cassie-Wenzel Transition Using Surfaces with Noncommunicating Roughness Elements", Mar. 4, 2009, Langmuir 2009, 25(8), 4815-4820.*

G. Reiter, Phys. Rev. Lett. 68, 75 (1992), Dewetting of Thin Polymer Films.

R. Yerushalmi-Rozen, J. Klein, and L. J. Fetters, Science, 263, 793 (1994), Supression of Rupture in Thin, Nonwetting Liquid Films.

J. Bischof et al., Phys. Rev. Lett. 77, 1536 (1996), Dewetting Modes of Thin Metallic Films: Nucleation of Holes and Spinodal Dewetting.

M. Khenner, Phys. Rev. B, 77, 165414(2008), Dewetting of an ultrathin solid film on a lattic-matched or amorphous substate.

O. Pierre-Louis, A. Chame, and Y. Saito, Phys. Rev. Lett., 99, 136101(2007), Dewetting of a Solid Monolayer.

J. Bischof, D. Scherer, S. Herminghaus, and P. Leiderer, Phys. Rev. Lett., 77, 1536(1996), Dewetting Modes of Thin Metallic Films: Nucleation of Holes and Spinodal Dewetting.

C. Schrank, C. Eisenmenger-Sittner, E. Neubauer, H. Bangert, A. Bergauer, Thin Solid Films, 459, 276(2004), Solid State De-wetting Observed for Vapor Deposited Copper Films on Carbon Substrates.

Jie Lian, Lumin Wang, Xiangcheng Sun, Qingkai Yu, and Rodney C. Ewing, Nano Letters, 6, 1047(2006), Patterning Metallic Nanostructures by Ion-Beam-Induced Dewetting and Rayleigh Instablility.

Ji-Myon Lee, Seong-Ju Park, *Proceedings of SPIE—The International Society for Optical Engineering*, v 5931, p. 1-7, 2005, *Nanoengineering: Fabrication, Properties, Optics, and Devices II*, Fabrication of nanostructures by dry etching using dewetted Pt islands as etch-masks.

Amare Benor, Arne Hoppe, Veit Wagner, Dietmar Knipp, Thin Solid Films 515 (2007) 7679-7682, Microcontact printing and selective surface dewetting for large area electronic applications.

* cited by examiner

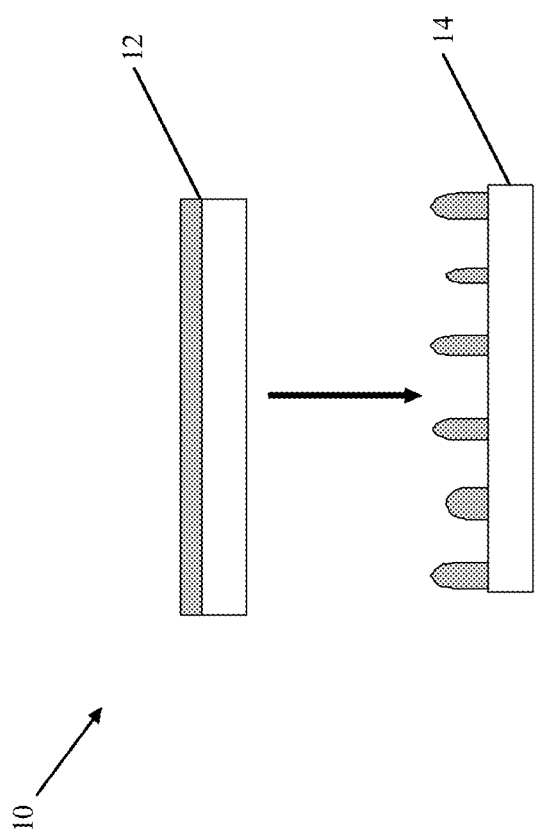

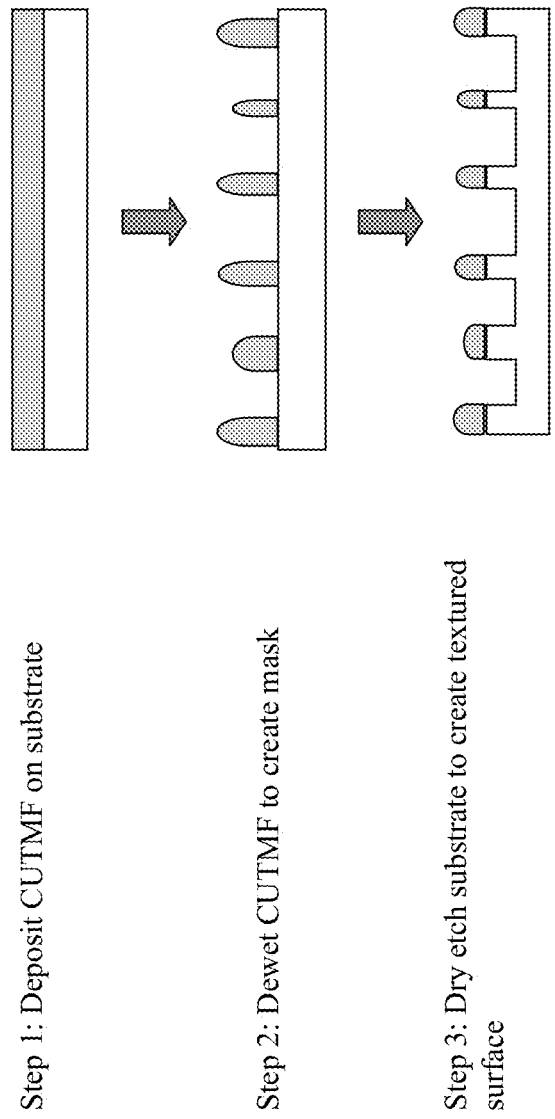

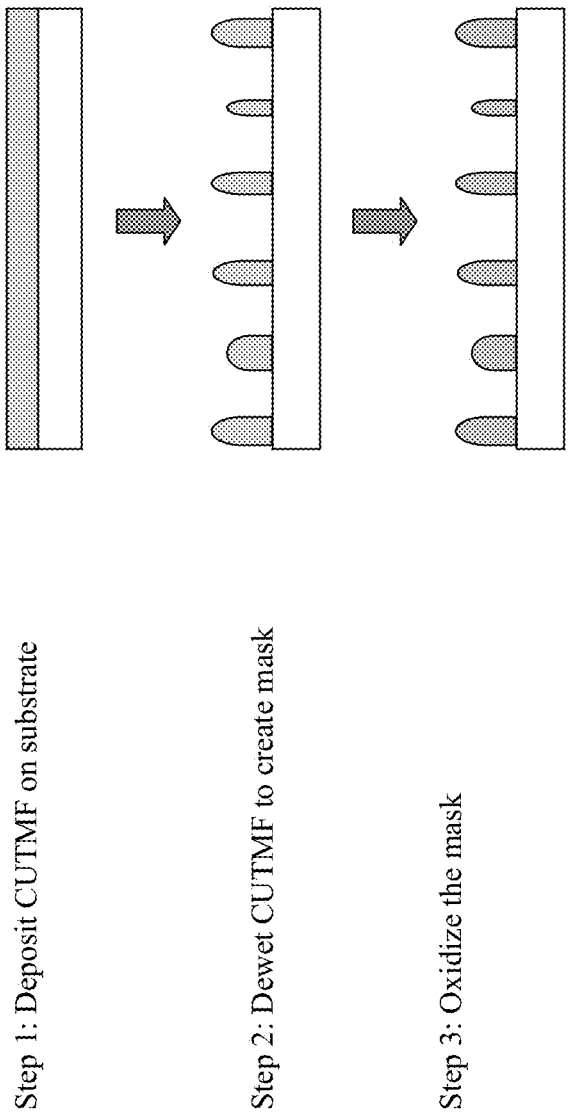

TEXTURED SURFACES AND METHODS OF MAKING AND USING SAME

CROSS-REFERENCE TO RELATED APPLICATIONS

This application claims the benefit of priority under 35 U.S.C. §119 of U.S. Provisional Patent Application Ser. No. 61/565,188 filed on 30 Nov. 2011, the contents of which are relied upon and incorporated herein by reference in their entirety as if fully set forth below.

TECHNICAL FIELD

The present disclosure relates generally to textured surfaces. More particularly, the various embodiments described herein relate to methods of producing surfaces having nanoscale texturing, as well as to the articles produced by such methods.

BACKGROUND

Touch-sensitive devices, such as touch screen surfaces (e.g., surfaces of electronic devices having user-interactive capabilities that are activated by touching specific portions of the surfaces), have become increasingly more prevalent. In general, these surfaces should exhibit high optical transmission, low haze, high durability, and low reflectivity, among other features. As the extent to which the touch screen-based interactions between a user and a device increases, so too does the likelihood that fingerprint or other undesirable residue can adversely affect the touch screen surface.

Fingerprint residue (e.g., natural fingerprint oil or grease, fingerborne oil or grease, and any other contaminants, such as dirt, cosmetics, hand creams/lotions, or the like, coupled therewith) can render a touch screen or any other aesthetic or functional surface unsightly, less user-friendly, and/or less functional. Further, an accumulation of such residue can lead to a distortion in the transmission, haze, and/or reflection properties of the touch screen surface. That is, as a user contacts and operates the touch screen surface, fingerprint residue is transferred to the surface. When a fingerprint residue-rich region of the surface is subsequently manipulated, the fingerprint residue can smudge or smear across the surface. These smudges and smear marks are visible to the naked eye, and can affect how an image from the touch screen surface is observed by a user. With significant build-up, in some cases, these smudges and smear marks can interfere with the function of a device by obscuring objects that must be seen for use and/or transmission of information into or from the device.

To combat the deleterious effects of fingerprint residue transfer (or other undesirable residue transfer), numerous so-called "anti-fingerprint" or "fingerprint-resistant" technologies have been developed. These technologies generally involve making a modification to the touch screen surface (e.g., texturing the surface) and/or applying a coating or film to the touch screen surface to render the surface both hydrophobic and oleophobic. The aim of such approaches is towards preventing the transfer of fingerprint residue in the first place, while also enabling easy removal of any residue that ultimately is transferred.

Unfortunately, while these approaches may improve the fingerprint resistance of some touch screen or other surfaces, the improvements generally are at the expense of other features. For example, certain hydrophobic and oleophobic coating materials can cause a decrease in transmission, an increase in haze, an increase in reflection, and/or a decrease in scratch resistance relative to the uncoated touch screen surface. In other cases, the improvement can come at the expense of processing time, complexity, and/or cost.

There accordingly remains a need for technologies that provide touch screen and other aesthetic or functional surfaces with improved resistance against the adverse effects of fingerprint or other undesirable residue. It would be particularly advantageous if such technologies did not adversely affect other desirable properties of the surfaces (e.g., transmission, haze, reflection, durability, scratch resistance, and the like) and/or significantly increase the time, complexity, and/or cost required to make such surfaces. It is to the provision of such technologies that the present disclosure is directed.

BRIEF SUMMARY

Described herein are various methods for making textured articles, textured articles that have improved fingerprint resistance, and methods of using the textured articles.

One type of textured article includes a substrate and a plurality of mortise-topped protrusions on a surface of the substrate. The mortise-topped protrusions can have an average height of about 5 nanometers to about 300 nanometers, an average longest lateral cross-sectional dimension of about 10 nanometers to about 1000 nanometers, and can be randomly oriented on the surface of the substrate so as to cover less than or equal to about 0.5 of an area fraction of the surface of the substrate.

In certain implementations of this type of textured article, the mortise-topped protrusions can have a mortise having an average longest lateral cross-sectional dimension less than or equal to about 95 percent of a longest cross-sectional dimension of a top surface of the mortise-topped protrusions and an average depth less than or equal to about 75 percent of the average height of the mortise-topped protrusions. In such cases, the mortise-topped protrusions can have only a single mortise.

In certain situations, the mortise-topped protrusions have an average height of about 50 nanometers to about 300 nanometers, have an average longest lateral cross-sectional dimension of about 10 nanometers to about 300 nanometers, and are randomly oriented on the surface of the substrate so as to cover about 0.1 to about 0.25 of an area fraction of the surface of the substrate. In some of these situations, the mortise-topped protrusions comprise a mortise having an average longest lateral cross-sectional dimension of about 40 percent to about 80 percent of a longest cross-sectional dimension of a top surface of the mortise-topped protrusions and an average depth of about 5 percent to about 60 percent of the average height of the mortise-topped protrusions. Further, the mortise-topped protrusions can have only a single mortise.

In some implementations of the textured article, the substrate can be a silicate glass, borosilicate glass, aluminosilicate glass, or boroaluminosilicate glass, and optionally comprises an alkali or alkaline earth modifier. In other implementations, the substrate is a glass-ceramic comprising a glassy phase and a ceramic phase, wherein the ceramic phase comprises β-spodumene, β-quartz, nepheline, kalsilite, or carnegieite. In still other situations, the substrate can be a ceramic material, or a polymer. Regardless of the type of substrate chosen, in certain cases, the substrate can have an average thickness of about 0.02 millimeters (mm) to about 2 mm.

With respect to various features or attributes of this type of textured article, the textured article can have a haze that is less than or equal to about 5 percent. The textured article can have an optical transmittance of the textured article is greater than or equal to about 92 percent over a visible spectrum of light (i.e., a wavelength range of about 390 to about 750 nm). A contact angle between the substrate of the textured article and water can be greater than or equal to about 135 degrees and/or a contact angle between the substrate and oleic acid can be greater than or equal to about 92 degrees. In some cases, an amount of tactilely-transferable residue that is transferred to the textured article can be less than or equal to about 1 milligram per tactile contact.

This type of textured article can form a portion of a touch-sensitive display screen or cover plate for an electronic device, a non-touch-sensitive component of an electronic device, a surface of a household appliance, or a surface of a vehicle component.

Another type of textured article can include a strengthened alkali aluminosilicate glass substrate that has an average thickness of about 0.02 millimeters to about 2.0 millimeters, and that has a plurality of mortise-topped protrusions on a surface. The mortise-topped protrusions can have an average height of less than or equal to about 200 nanometers, an average longest lateral cross-sectional dimension of less than or equal to about 150 nanometers, and can be randomly oriented on the surface of the strengthened alkali aluminosilicate glass substrate so as to cover less than or equal to about 0.20 of an area fraction of the surface of the strengthened alkali aluminosilicate glass substrate.

In some implementations of this type of textured article, the average longest lateral cross-sectional dimensions of the mortises can be about 50 to about 90 percent of the longest cross-sectional dimension of the top surface of the protrusions and/or the average depth of the mortises can be about 10 to about 40 percent of the average height of the protrusions.

In certain alternative or overlapping implementations, the mortise-topped protrusions can have only a single mortise.

A haze of this type of textured article can be less than or equal to about 3 percent. An optical transmittance of this type of textured article can be greater than or equal to about 94 percent over a visible spectrum of light. In certain implementations, a contact angle between the textured strengthened alkali aluminosilicate glass substrate and water can be greater than or equal to about 140 degrees and/or a contact angle between the textured strengthened alkali aluminosilicate glass substrate and oleic acid can be greater than or equal to about 93 degrees. In some cases, an amount of tactilely-transferable residue that is transferred to the textured article can be less than or equal to about 0.5 milligrams per tactile contact.

One type of method for forming a textured article can include disposing a mask having nanostructured metal-containing features on a surface of a substrate, and dry etching at least portions of the surface of the substrate on which the mask is not disposed and/or oxidizing the nanostructured metal-containing features of the mask. When dry etching is used, the dry etching step can produce a plurality of mortise-topped protrusions on the surface of the substrate.

In some implementations of this type of method, disposing the mask having nanostructured metal-containing features on the surface of the substrate can entail providing the substrate comprising a continuous ultra-thin metal-containing film or film stack disposed on the surface of the substrate, and dewetting at least a portion of the continuous ultra-thin metal-containing film or film stack to produce a plurality of discrete metal-containing dewetted islands on the surface of the substrate. The method can further include a step of removing the nanostructured metal-containing features from the surface of the substrate after the dry etching. Similarly, the method can also include the step of repeating the dry etching of the portions of the surface of the substrate on which the mask is not disposed to produce additional textured features having distinct topological features from the initial textured features, which, in certain cases, are mortise-topped protrusions.

It is to be understood that both the foregoing brief summary and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 1 is a schematic illustration of a method for making patterned articles having nanostructured features.

FIG. 2 is a schematic illustration of a method for making textured articles having nanostructured features.

FIG. 3 is a schematic illustration of a method for making textured articles having nanostructured features.

Figure 4B:
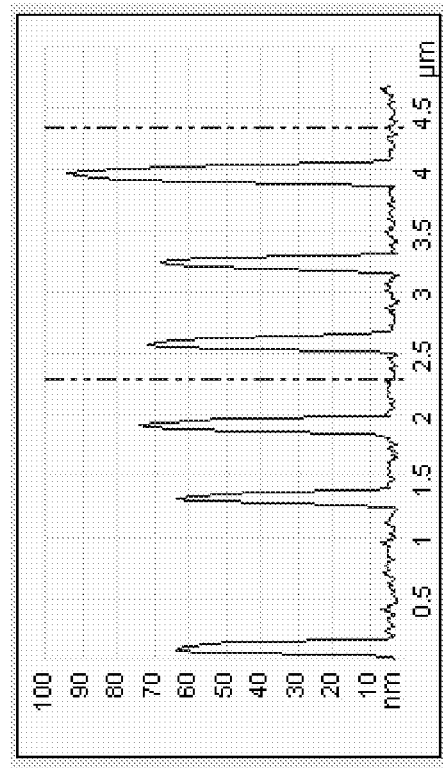
FIG. 4b is a graphical representation of the height profile for a given line across the sample shown in the AFM image of FIG. 4a in accordance with EXAMPLE 1.

These and other aspects, advantages, and salient features will become apparent from the following detailed description, the accompanying drawings, and the appended claims.

DETAILED DESCRIPTION

Referring now to the figures, wherein like reference numerals represent like parts throughout the several views, exemplary embodiments will be described in detail. Throughout this description, various components may be identified having specific values or parameters. These items, however, are provided as being exemplary of the present disclosure. Indeed, the exemplary embodiments do not limit the various aspects and concepts, as many comparable parameters, sizes, ranges, and/or values may be implemented. Similarly, the terms "first," "second," "primary," "secondary," "top," "bottom," "distal," "proximal," and the like, do not denote any order, quantity, or importance, but rather are used to distinguish one element from another. Further, the terms "a," "an," and "the" do not denote a limitation of quantity, but rather denote the presence of "at least one" of the referenced item.

Provided herein are various methods for making textured articles, textured articles that have improved fingerprint resistance, and methods of using the textured articles. The methods generally make use of masks comprising nanostructured metal-containing features to produce textured surfaces that also comprise nanostructured features. These nanostructured features in the textured surfaces can render the surfaces hydrophobic and oleophobic, thereby beneficially providing the articles with improved fingerprint resistance relative to similar or identical articles that lack the texturing. In addition, and as will be described in more detail below, the textured articles can exhibit high transmission, low haze, low reflectivity, and high durability, among other features.

As used herein, the terms "anti-fingerprint," "fingerprint resistance," or "fingerprint-resistant" refer to the ability of a surface to resist the visible transfer of residue from tactile interactions with a user; the non-wetting properties of a surface with respect to such tactilely-transferable residue; the minimization, hiding, or obscuring of tactilely-transferable residue on a surface; and combinations thereof. An anti-fingerprint or fingerprint-resistant surface must therefore be resistant to both water and oil transfer when tactilely contacted by a user. Stated another way, an anti-fingerprint or fingerprint-resistant surface must be both hydrophobic and oleophobic.

In addition, the term "oleophobic" is used herein to refer to a material that imparts a wetting characteristic such that the contact angle between oleic acid and a surface formed from the material is greater than 90 degrees (°). Analogously, the term "hydrophobic" is used herein to refer to a material that imparts a wetting characteristic such that the contact angle between water and a surface formed from the material is greater than 90°.

Further, the term "tactilely-transferable residue" is used herein for convenience to generically refer to and encompass any undesirable residue that is contacted with a surface by a given user. This includes natural human-oils or grease, as well as any other materials coupled therewith (e.g., dirt, cosmetics, food particles, hand creams/lotions, or the like) that are contacted with the surface via a finger, palm, wrist, forearm/elbow (e.g., when an appliance door is closed or otherwise manipulated by a forearm or an elbow), or other body part.

As stated above, the methods of making the textured articles generally involve the steps of disposing a mask having nanostructured metal-containing features on a surface of a substrate, followed by dry etching portions of the surface of the substrate on which the mask is not disposed and/or oxidizing the nanostructured metal-containing features of the mask.

The mask can be disposed on the surface of the substrate using a variety of techniques for preparing nanostructured features on a substrate. One exemplary process for disposing a mask on the surface of the substrate is a dewetting process that makes use of a continuous ultra-thin metal-containing film or film stack (collectively referred to herein for convenience as "CUTMFs") as the material to be dewetted. That is, the CUTMFs are disposed on the substrates, and are subsequently dewetted to produce the desired masks on the substrates. As will be described in more detail below, by changing the dewetting process parameters, including, for example, the time, temperature, and atmosphere of the dewetting step, the nanostructured pattern of the masks can be tailored. For example, the lateral dimensions of the nanostructured features of the masks, the height of the nanostructured features of the masks, and/or the percentage of the overall area of the surface of the substrate covered by the nanostructured features of the masks can each be controlled.

For the avoidance of doubt, the term "ultra-thin" is used herein to refer to films or film stacks that have an average thickness of less than or equal to about 30 nm. Also, as used herein, the term "continuous" refers to films or film stacks whose perimeter defines an area or region that comprises less than 1 percent (%) of openings or void spaces.

The various methods of making the patterned masks are schematically illustrated in FIG. 1. These methods, generically designated by numeral 10, include the steps of providing a substrate comprising a CUTMF disposed on a surface thereof 12, and dewetting the CUTMF to produce a plurality of discrete metal-containing dewetted islands on the surface of the substrate 14. It is the plurality of discrete metal-containing dewetted islands on the surface of the substrate that serve as the mask.

Provision of the CUTMF-coated substrate can first involve selection of an appropriate set of materials for use as the substrate and the CUTMF. These choices will be made based on the particular use of the mask. In general, however, a variety of substrates and CUTMFs can be used, with the proviso that they are not adversely affected by each other and/or the conditions to which they will be exposed. That is, the CUTMF material should be compatible with the substrate, such that the substrate does not deform, undergo an undesirable chemical reaction, melt, sublime, decompose, or the like, when the CUTMF is formed or disposed on the surface of the substrate and/or when the mask is used to produce the textured surface. Similarly, the substrate and CUTMF materials should be chosen such that they do not undergo an undesirable chemical reaction, melt, sublime, decompose, or the like (other than the physical process of dewetting), during the dewetting step or during the subsequent dry etching step and/or oxidizing step.

With these considerations in mind, the substrate can be a glass material, a glass-ceramic material, a ceramic material, a polymeric material, or the like. By way of illustration, with respect to glasses, the material chosen can be any of a wide range of silicate, borosilicate, aluminosilicate, or boroaluminosilicate glass compositions, which optionally can comprise one or more alkali and/or alkaline earth modifiers. One such glass composition includes the following constituents: 58-72 mole percent (mol %) $SiO_2$; 9-17 mol % $Al_2O_3$; 2-12 mol % $B_2O_3$; 8-16 mol % $Na_2O$; and 0-4 mol % $K_2O$, wherein the ratio $$\frac{Al_2O_3 \text{ (mol \%)} + B_2O_3 \text{ (mol \%)}}{\sum \text{ modifiers (mol \%)}} > 1,$$

where the modifiers comprise alkali metal oxides. Another glass composition includes the following constituents: 61-75 mol % $SiO_2$; 7-15 mol % $Al_2O_3$; 0-12 mol % $B_2O_3$; 9-21 mol % $Na_2O$; 0-4 mol % $K_2O$; 0-7 mol % MgO; and 0-3 mol % CaO. Yet another illustrative glass composition includes the following constituents: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % MgO; 0-10 mol % CaO; 0-5 mol % $ZrO_2$; 0-1 mol % $SnO_2$; 0-1 mol % $CeO_2$; less than 50 parts per million (ppm) $As_2O_3$; and less than 50 ppm $Sb_2O_3$; wherein 12 mol %≤$Li_2O$+$Na_2O$+$K_2O$≤20 mol %, and 0 mol %≤MgO+CaO≤10 mol %. Still another illustrative glass composition includes the following constituents: 55-75 mol % $SiO_2$, 8-15 mol % $Al_2O_3$, 10-20 mol % $B_2O_3$; 0-8% MgO, 0-8 mol % CaO, 0-8 mol % SrO, and 0-8 mol % BaO.

Similarly, with respect to glass-ceramics, the material chosen can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, or carnegieite.

If the substrate is formed from a ceramic material, it can be any of a variety of oxides, carbides, nitrides, oxycarbides, carbonitrides, or the like, whether in polycrystalline or single crystal form. One such ceramic is polycrystalline $Al_2O_3$. Another illustrative ceramic is polycrystalline SiC. Yet another illustrative ceramic material is single-crystal GaAs (e.g., as used in the fabrication of certain semiconductor devices).

If the substrate is formed from a polymer material, it can be chosen from a variety of thermosetting or thermoplastic materials, including those that are polyamides, polyesters, polyimides, polysulfones, polycarbonates, polyurethanes, polyurethane-ureas, polyolefins, phenols, epoxies, polyacrylates, polymethylacrylates, polystyrenes, polyhydroxy acids, polyanhydrides, polyorthoesters, polyphosphazenes, polyphosphates, copolymers thereof, blends thereof, or the like.

Regardless of the material chosen therefor, the substrate can adopt a variety of physical forms. That is, from a cross-sectional perspective, the substrate can be flat or planar, or it can be curved and/or sharply-bent. Similarly, it can be a single unitary object, or a multi-layered structure or laminate.

In certain situations, the substrate can be subjected to an optional treatment in preparation for application of the CUTMF. Examples of such treatments include physical or chemical cleaning, physical or chemical strengthening (e.g., by thermal tempering, chemical ion-exchange, or like processes in the case of a glass), physical or chemical etching, physical or chemical polishing, annealing, sintering, shaping, and/or the like. Such processes are known to those skilled in the art to which this disclosure pertains.

Once the substrate has been selected and/or prepared, the CUTMF material can be selected and disposed on the substrate. In addition to the above considerations in mind, the materials used to form the CUTMF must be chosen such that at least a portion of the final CUTMF (i.e., before dewetting) comprises a metal that is in its elemental form or that is a constituent of an alloy with one or more other metals. One such CUTMF is a film that consists of an elemental metal or an alloy. Another illustrative CUTMF is a film that includes an elemental metal or an alloy along with a passivation layer (e.g., an oxide, halide, chalcogenide, or the like, of a metal, which can be the same metal as the elemental metal, one of the constituents of the alloy, or an entirely different metal) on an upper/outer surface of the CUTMF. Yet another illustrative CUTMF is a film stack that includes two or more layers, wherein each layer independently consists of an elemental metal or an alloy. Still another illustrative CUTMF is a film stack that includes two or more layers, wherein each layer independently includes an elemental metal or an alloy, and wherein each layer can also include a passivation layer. Examples of such metals include Cu, Ni, Ti, Ag, Cr, Al, Au, or the like.

Depending on the materials chosen, the CUTMF can be formed using a variety of techniques. In general, the CUTMF is not a free-standing film that can be applied (e.g., via an adhesive or other fastening means) to the surface of the substrate, but is, in fact, physically formed on the surface of the substrate. By way of example, the CUTMF can be fabricated using any of the variants of chemical vapor deposition (CVD) (e.g., plasma-enhanced CVD, aerosol-assisted CVD, metal organic CVD, and the like), any of the variants of physical vapor deposition (PVD) (e.g., ion-assisted PVD, pulsed laser deposition, cathodic arc deposition, sputtering, and the like), atomic layer deposition, spray coating, spin-coating, dip-coating, inkjetting, sol-gel processing, or the like. Such processes are known to those skilled in the art to which this disclosure pertains.

As stated above, the CUTMF must be at least "continuous" (i.e., it must comprise less than 1% of openings or void spaces in the area defined by its perimeter) and "ultra-thin" (i.e., it must have an average thickness of less than or equal to about 30 nm). In certain implementations, however, the CUTMF can have no openings or void spaces in the area defined by its perimeter. Similarly, in certain implementations, the CUTMF can have an average thickness of less than or equal to about 10 nm.

In some cases, the CUTMF-coated substrate can be subjected to an optional treatment in preparation for the dewetting step. Examples of such treatments include physical or chemical cleaning, physical or chemical strengthening, physical or chemical etching, physical or chemical polishing, annealing, sintering, shaping, and/or the like. Such processes are known to those skilled in the art to which this disclosure pertains.

Once the CUTMF has been disposed on at least a portion of the substrate, the CUTMF-coated substrate can be dewetted. The dewetting step generally involves subjecting the CUTMF-coated substrate to a thermal treatment that is sufficient to overcome the activation barrier against atomic diffusion in the CUTMF, such that the CUTMF breaks down into a plurality of discrete metal-containing islands (just as with the CUTMF, the metal-containing islands must also comprise a metal that is in its elemental form or that is a constituent of an alloy with one or more other metals) on the surface of the substrate in order to reduce the free energy of the system.

In situations where a film stack is used as the CUTMF, instead of the entire CUTMF dewetting, the dewetting step can alternatively result in an outer layer (i.e., a layer of the CUTMF stack not most adjacent to the substrate surface) dewetting, while leaving an inner layer (i.e., a layer of the stack more adjacent to the substrate surface than the outer layer) behind as a continuous layer on the surface of the substrate. For example, if the CUTMF includes two different layers, and the surface energy of the outer layer of the CUTMF stack is higher than that of 1) the interface between the outer layer and the inner layer of the stack, 2) the inner layer of the stack itself, 3) the interface between the inner layer of the stack and the substrate, and 4) the substrate itself, then the outer layer will dewet from the inner layer during the dewetting step. This will result in the metal-containing islands, which were formed from the outer layer of the CUTMF stack, to be formed on the inner layer of the CUTMF stack. The remaining inner layer in such situations will have an average thickness of less than or equal to about 5 nm. In certain cases, the remaining inner layer can have an average thickness of less than or equal to about 3 nm.

In some of these implementations, additional dewetting can result in the at least a portion of the inner layer of the CUTMF stack dewetting, too. Thus, at least some of the metal-containing islands can comprise one region formed from the material of the outer layer of the CUTMF stack and another region formed from the material of the inner layer of the CUTMF stack. It is also possible for at least some of the metal-containing islands to comprise at least a region formed from an alloy or combination of the materials of the inner and outer layers of the CUTMF stack.

Advantageously, the dewetting step can make use of significantly lower temperatures and/or durations than existing dewetting technologies, while simultaneously producing smaller islands on the surface of the substrate. Specifically, the thermal treatment generally involves temperatures of less than or equal to about 800° C. In certain implementations, the thermal treatment involves temperatures of less than or equal to about 600° C. In other implementations, such as many of those where a film stack is used, the thermal treatment involves temperatures of less than or equal to about 200° C. With respect to timing, the thermal treatment generally takes less than or equal to about 1 hour. In certain implementations, the thermal treatment can be completed in less than or equal to about 10 minutes. In other implementations, the thermal treatment can be completed in less than or equal to about 30 seconds.

The dewetting step can be carried out in a variety of conditions. For example, in certain implementations, the dewetting step will be performed while the sample is maintained under reduced pressure or vacuum conditions. In other implementations, the dewetting step can be performed under ambient pressure conditions. In addition to pressure, the atmosphere in which the CUTMF-coated substrate is maintained during the thermal treatment can be varied. That is, in certain implementations, a gas (other than air) can be flowed over the CUTMF-coated substrate during the thermal treatment. Such gases can include $O_2$, $N_2$, Ar, or the like.

Those skilled in the art to which this disclosure pertains will recognize that a variety of temperatures, durations, pressures, and atmospheric conditions can be implemented during the thermal treatment of the dewetting step. By way of example, one specific dewetting step can involve heating a CUTMF-coated substrate in a furnace, which is held at about 1 atmosphere of pressure (i.e., ambient pressure) while an inert gas (e.g., $N_2$ or Ar) flows throughout the furnace, at a temperature of less than or equal to about 600° C. for about 30 seconds to about 2 minutes. In contrast, another specific dewetting step can involve heating a CUTMF-coated substrate in a vacuum furnace at a temperature of about 180° C. to about 500° C. for about 1 minute to about 1 hour.

Once the dewetting step has been performed, the resulting patterned article comprising the plurality of discrete metal-containing dewetted islands will serve as the mask for the subsequent dry etching and/or oxidizing steps. With the variety of potential conditions of the dry etching and/or oxidizing steps described herein, it should be understood that the specific features or properties of a particular mask will depend on the actual conditions of these subsequent steps. The following description, however, will provide some general considerations.

There is no particular limitation on the average thickness of the substrate contemplated herein. In many applications, however, the average thickness will be less than or equal to about 15 mm. If the final textured article is to be used in applications where it may be desirable to optimize thickness for weight, cost, and/or strength characteristics (e.g., in electronic devices), then even thinner substrates (e.g., less than or equal to about 5 mm) can be used. By way of example, if the textured article is intended to function as a cover for a touch screen display, then the substrate can exhibit an average thickness of about 0.02 mm to about 2.0 mm.

In contrast to the substrate, where thickness is not limited, the dimensional parameters of the dewetted metal-containing islands will be limited to the nanoscale given the average thicknesses of the CUTMFs. Thus, the average height of the dewetted metal-containing islands should be about 5 nm to about 300 nm. In certain situations, however, the average height of the dewetted metal-containing islands can be about 20 nm to about 100 nm. In addition, the average longest lateral cross-sectional dimension of the dewetted metal-containing islands should be about 10 nm to about 1000 nm. As used herein, the term "longest lateral cross-sectional dimension" refers to a particular dimension of an item or object that is parallel to the surface of the substrate. Thus, to clarify, when an object is circular, the longest lateral cross-sectional dimension is its diameter; when an object is oval-shaped, the longest lateral cross-sectional dimension is the longest diameter of the oval; and when an object is irregularly-shaped, the longest lateral cross-sectional dimension is the line between the two farthest opposing points on the perimeter of the object. In certain situations, the average longest lateral cross-sectional dimension of the dewetted metal-containing islands can be about 30 nm to about 200 nm.

Further, the area fraction of the surface of the substrate that is covered by the dewetted metal-containing islands should be less than or equal to about 0.5. That is, less than or equal to about 50% of the total area of the surface of the substrate that was initially covered by the CUTMF will be covered by the dewetted metal-containing islands. In certain situations, the area fraction of the surface of the substrate that is covered by the dewetted metal-containing islands can be less than or equal to about 0.25.

To achieve smaller average thicknesses, average longest lateral cross-sectional dimensions, and/or area fractions of the dewetted metal-containing islands, the average thickness of the CUTMFs can be decreased and/or the extent of dewetting can be increased.

The as-produced mask can be subjected to an optional treatment in preparation for the dry etching and/or oxidizing step. Examples of such treatments include physical or chemical cleaning, physical or chemical strengthening of the substrate, physical or chemical polishing, annealing, sintering, shaping, and/or the like. Such processes are known to those skilled in the art to which this disclosure pertains.

The mask, which comprises the plurality of discrete metal-containing dewetted islands, is now ready for the dry etching and/or oxidizing steps that result produce the final textured article.

The dry etching step generally involves subjecting at least the portions of the surface of the substrate on which the plurality of discrete metal-containing dewetted islands are not disposed to a plasma of gases (e.g., for plasma sputter-etching, plasma etching, reactive ion etching, or the like). For convenience only, and without any intent to be limiting, the portions of the surface of the substrate on which the plurality of discrete metal-containing dewetted islands are not disposed will be termed "uncovered portions of the surface of the substrate" throughout the remainder of this Detailed Description. The plasma of gases can etch by chemically reacting with the uncovered portions of the surface of the substrate and/or physically bombarding the uncovered portions of the surface of the substrate. It should be noted that the plasma of gases can also etch the discrete metal-containing dewetted islands. In such cases, the plasma of gases preferentially etches the uncovered portions of the surface of the substrate over the discrete metal-containing dewetted islands.

One illustrative type of plasma of gases comprises a fluorine source (e.g., $CHF_3$, $CF_4$, $SF_6$, or the like) that can be used to selectively react with and/or bombard at least Si-containing substrate components. A second illustrative plasma of gases comprises a fluorine source and a chlorine source (e.g., $BCl_3$, $F_2$, or the like), such that the fluorine source can be used to selectively react with and/or bombard Si-containing substrate components and the chlorine source can be used to selectively react with and/or bombard at least Al—, Na—, Ga—, or K— containing substrate components among others. Another illustrative plasma of gases comprises Ar or $N_2$ that can be used to bombard a variety of substrate components. Yet another illustrative plasma of gases comprises a fluorine source, a chlorine source, and Ar. Still another illustrative plasma of gases comprises a fluorine source and Ar.

Once the dry etching step is complete, the plurality of discrete metal-containing dewetted islands can optionally be removed or separated from the substrate. This can be done, for example, by solubilizing the plurality of discrete metal-containing dewetted islands. Those skilled in the art to which this disclosure pertains can readily select appropriate chemicals and parameters for this step without undue experimentation.

By adjusting the ratios of the components of the plasma of gases, the flow of the plasma of gases, the duration of the exposure to the plasma of gases, the temperature of the sample, and/or the ambient pressure, different textured features can be achieved. In general, however, the texturing in the substrate can appear pillar-like or island-like in structure. These pillar-like or island-like protrusions generally have non-uniform uppermost or top surfaces (i.e., those surfaces that are farthest from the surface of the substrate). That is, the top surfaces of the protrusions can be rounded or have a depression, dimple, or mortise therein. For convenience only, and without any intent to be limiting, protrusions that have such a feature in the top surface will be termed "mortise-topped protrusions" throughout this specification. In many instances, there will only be a single mortise in the mortise-topped protrusions.

The extent of the dry etching, and thus texturing, will depend on the use or application for the final textured article. That is, the uncovered portions of the surface of the substrate will generally dictate where the texturing will occur, but the depth of the etching, the lateral dimensions of the individual textured features (i.e., protrusions), the dimensions of the mortise, and the area fraction of the surface that is textured will be dictated by the dry etching process itself.

Given the breadth of potential uses for the fingerprint-resistant dry-etch textured articles described herein, it should be understood that the specific features or properties of a particular dry-etch textured article will depend on the ultimate application therefor or use thereof. The following description, however, will provide some general considerations.

The depth of dry etching, or the height of the dry-etch textured features, can vary up to substantially the entire thickness of the substrate (or the thickness of the combined the plurality of discrete metal-containing dewetted islands and substrate). In many exemplary applications, however, the average height will be less than or equal to about 500 nm. If the textured article is to be used in applications where it may be desirable to optimize texturing for reflectivity, durability, weight, or cost characteristics (e.g., in electronic devices, or the like), then even shorter textured features (e.g., about 50 nm to about 300 mm) can be used. By way of example, if the textured article is intended to function as a cover for a touch screen display to provide improved fingerprint resistance and improved reflection-resistance, then the average height of the textured features can be about 100 nm to about 200 nm.

The average longest lateral cross-sectional dimension of the dry-etch textured features should be less than or equal to about the thickness of the dewetted metal-containing islands that serve as the mask. Given, however, that the dry etching process can also remove portions of the dewetted metal-containing islands, while preferentially removing the uncovered portions of the surface of the substrate (as well as portions of the substrate that are below the dewetted metal-containing islands because of the anisotropic nature of dry etching), the average longest lateral cross-sectional dimension of the textured features will generally be less than 500 nm. In some situations, the average longest lateral cross-sectional dimension of the textured features can be about 10 nm to about 300 nm. In situations where even smaller texture features are desirable, the average longest lateral cross-sectional dimension of the textured features can be about 50 nm to about 150 nm.

In embodiments where the textured features are mortise-topped protrusions, the average longest lateral cross-sectional dimensions of the mortises should be less than or equal to about 95 percent of the longest cross-sectional dimension of the top surface of the protrusions. In most instances, the average longest lateral cross-sectional dimensions of the mortises will generally be less than or equal to about 85 percent of the longest cross-sectional dimension of the top surface of the protrusions. In some situations, the average longest lateral cross-sectional dimensions of the mortises will be about 40 to about 80 percent of the longest cross-sectional dimension of the top surface of the protrusions.

In addition, the depth of the mortises can vary up to substantially the entire protrusion. In most instances, however, the average depth of the mortises will be less than or equal to about 75 percent of the average height of the protrusions. In some instances, the average depth of the mortises will be about 5 to about 60 percent of the average height of the protrusions.

Further, the area fraction of the substrate that is covered by the dry-etch textured features should be less than or equal to about 0.5, both at the top and bottom of the textured features. In certain situations, the area fraction of the substrate that is covered by the textured features can be about 0.10 to about 0.25 both at the top and bottom of the textured features.

In general, the optical transmittance of the dry-etch textured article will depend on the type of materials chosen. For example, certain textured articles can have a transparency over the entire visible spectrum of at least about 85%. In certain cases where the textured article is used in the construction of a touch screen for an electronic device, for example, the transparency of the textured article can be at least about 92% over the visible spectrum. In situations where the substrate comprises a pigment (or is not colorless by virtue of its material constituents), the transparency can diminish, even to the point of being opaque across the visible spectrum. Thus, there is no particular limitation on the optical transmittance of the textured article itself.

Like transmittance, the haze of the dry-etch textured article can be tailored to the particular application. As used herein, the terms "haze" and "transmission haze" refer to the percentage of transmitted light scattered outside an angular cone of ±4.0° in accordance with ASTM procedure D1003, the contents of which are incorporated herein by reference in their entirety as if fully set forth below. For an optically smooth surface, transmission haze is generally close to zero. In those situations when the textured article is used in the construction of a touch screen for an electronic device, the haze of the textured article can be less than or equal to about 5%.

Regardless of the application or use, the dry-etch textured articles described herein offer improved fingerprint resistance relative to identical articles that lack the texturing described herein. While fingerprint resistance can appear to be a qualitative and potentially subjective characterization, there are a number of quantifiable indications of fingerprint-resistance, examples of which will now be described.

One quantifiable indication of this improved fingerprint resistance can be seen in the amount of tactilely-transferable residue that is actually transferred from a user to the article during use. That is, when a user tactilely interacts with the dry-etch textured article, some amount of tactilely-transferable residue can transfer to the article. The mass of the tactilely-transferable residue on the textured article after each interaction can be quantified, for example, by weighing the mass thereof. In most situations, the amount of tactilely-transferable residue that is actually transferred from a user to the textured article is less than or equal to about 1 milligram (mg) per tactile contact or interaction. In some implementations, less than or equal to about 0.02 mg per tactile contact of such materials is transferred, while in other implementations, less than or equal to about 0.01 mg per tactile interaction of such materials is transferred.

Another quantifiable indication of the improved fingerprint resistance can be seen in the contact angles between the dry-etch textured article and water and/or oleic acid (i.e., the hydrophobicity and/or the oleophobicity, respectively). In general, the textured articles described herein are hydrophobic and oleophobic. In some implementations, however, the contact angle between the textured article and water can be at least about 135°, and the contact angle between the textured article and oleic acid can be at least about 92°. In other implementations, these contact angles can be at least about 150° and at least about 95°, respectively.

As an alternative, or in addition, to the dry etching step, the mask can be subjected to an oxidation step such that the nanostructured metal-containing features of the mask are at least partially oxidized to form a different composition (e.g., an oxide). The oxidation step generally involves subjecting the plurality of discrete metal-containing dewetted islands disposed on the surface of the substrate to an oxidant gas (e.g., $O_2$, $O_3$, $NO_2$, or the like). The oxidation step can be carried out in the presence of absence of heat.

The oxidation step results in textured features that are disposed on the surface of the substrate (rather than features that are created by removing portions of the surface of the substrate as in the case of dry etching, regardless of whether or not the plurality of discrete metal-containing dewetted islands are optionally removed after the dry etching step). Thus, the texturing features resulting from the oxidation step will depend highly on the composition and structure of the plurality of discrete metal-containing dewetted islands. The properties of the textured article, however, will depend on the substrate and the oxidized plurality of discrete metal-containing dewetted islands. In general, the optical transmittance, haze, and fingerprint resistance of the oxidized textured articles can be similar to or the same as these properties of the dry etch textured articles.

In certain implementations of the methods for making textured articles described herein, the oxidizing step can be followed by the dry etching step to produce a texture both on top of the substrate and within the substrate. This additional dry etching step can result in the textured features having more than one set of topological features. Alternatively, the dry etching step (or the optional step of removing the plurality of discrete metal-containing dewetted islands) can be followed by another dry etching step to produce additional texturing such that the textured features have more than one set of topological features. Such textured structures have more than one set of topological features are described in greater detail (although on a larger scale) in U.S. patent application Ser. No. 12/763,649, the entire contents of which are incorporated herein by reference as if fully set forth below.

Once the textured article is formed, it can be used in a variety of applications where the textured article will come into contact with tactilely-transferable residue. These applications encompass touch-sensitive display screens or cover plates for various electronic devices (e.g., cellular phones, personal data assistants, computers, tablets, global positioning system navigation devices, and the like), non-touch-sensitive components of electronic devices, surfaces of household appliances (e.g., refrigerators, microwave ovens, stovetops, oven, dishwashers, washers, dryers, and the like), and vehicle components, just to name a few devices that might be tactilely manipulated or accessed.

In a specific embodiment, which may be particularly advantageous for applications such as touch sensitive electronic devices, a fingerprint-resistant textured article is formed using a chemically strengthened (ion exchanged) alkali aluminosilicate flat glass sheet as the substrate. The method for making such a fingerprint-resistant textured article is schematically illustrated in FIG. 2. As seen in FIG. 2, first, the CUTMF is disposed on a surface of the alkali aluminosilicate flat glass sheet substrate. The CUTMF comprises a single layer of a metal such as Ag, Ni, or Cu, having an average thickness between about 6 nm and about 15 nm. The CUTMF is coated directly on one surface of the chemically strengthened (ion exchanged) alkali aluminosilicate flat glass sheet using magnetron sputtering. Next, the CUTMF is dewetted to produce a plurality of discrete metal-containing dewetted islands on the surface of the alkali aluminosilicate flat glass sheet substrate. The dewetting step is carried out in a rapid thermal annealing furnace at ambient pressure, while $N_2$ or Ar flows over the CUTMF-coated substrate to prevent oxidation of the CUTMF, at a temperature of about 750° C. for about 50 seconds to about 2 minutes. The dewetted metal-containing islands can have an average height of less than about 130 nm, and an average longest lateral cross-sectional dimension of about 50 nm to about 200 nm. The area fraction of the surface of the chemically strengthened (ion exchanged)

alkali aluminosilicate glass substrate that is covered by the dewetted metal-containing islands can be less than or equal to about 0.25. It is the plurality of discrete metal-containing dewetted islands on the surface of the alkali aluminosilicate flat glass sheet substrate that serve as the mask. As shown in FIG. 2, the third step involves dry etching the uncovered portions of the substrate to create a textured surface. The dry etching step can be carried out using a plasma of gases comprising $SF_6$, or $CF_3H$ and Ar in a reactive ion etching chamber. Although not shown in FIG. 2, the method can further include the optional step of removing the plurality of discrete metal-containing dewetted islands from the surface of the alkali aluminosilicate glass sheet substrate.

Such a textured article can be used in the fabrication of a touch screen display for an electronic device. The average height of the textured features, which are mortise-topped protrusions, can be less than or equal to about 200 nm. The average longest lateral cross-sectional dimension of the textured features can be less than or equal to about 150 nm. The average longest lateral cross-sectional dimensions of the mortises will be about 50 to about 90 percent of the longest cross-sectional dimension of the top surface of the protrusions. The average depth of the mortises will be about 10 to about 40 percent of the average height of the protrusions. The area fraction of the substrate that is covered by the textured features can be less than or equal to about 0.20. The textured article can have an optical transmittance of at least about 94% and a haze of less than 3%. The amount of tactilely-transferable residue that is actually transferred from a user to the textured article can be less than or equal to about 0.5 mg per tactile contact or interaction. Finally, the contact angle between the textured article and water can be at least about 140°, and the contact angle between the textured article and oleic acid can be at least about 93°.

In another specific embodiment, a fingerprint-resistant textured article is formed using a chemically strengthened (ion exchanged) alkali aluminosilicate flat glass sheet as the substrate. The method for making such a fingerprint-resistant textured article is schematically illustrated in FIG. 3. The first two steps shown in FIG. 3 are identical to that of FIG. 2 (as described immediately above). That is, first, the CUTMF is disposed on a surface of the alkali aluminosilicate flat glass sheet substrate. The CUTMF comprises a single layer of a metal such as Ag, Ni, or Cu, having an average thickness between about 6 nm and about 15 nm. The CUTMF is coated directly on one surface of the chemically strengthened (ion exchanged) alkali aluminosilicate flat glass sheet using magnetron sputtering. Next, the CUTMF is dewetted to produce a plurality of discrete metal-containing dewetted islands on the surface of the alkali aluminosilicate flat glass sheet substrate. The dewetting step is carried out in a rapid thermal annealing furnace at ambient pressure, while $N_2$ or Ar flows over the CUTMF-coated substrate to prevent oxidation of the CUTMF, at a temperature of about 750° C. for about 50 seconds to about 2 minutes. The dewetted metal-containing islands can have an average height of less than about 130 nm, and an average longest lateral cross-sectional dimension of about 50 nm to about 200 nm. The area fraction of the surface of the chemically strengthened (ion exchanged) alkali aluminosilicate glass substrate that is covered by the dewetted metal-containing islands can be less than or equal to about 0.10. It is the plurality of discrete metal-containing dewetted islands on the surface of the alkali aluminosilicate flat glass sheet substrate that serve as the mask. As shown in FIG. 3, the third step involves oxidizing the mask to create a textured surface. The oxidation step can be carried out at ambient temperature with $O_2$ flowing over the masked substrate.

Such a textured article can be used in the fabrication of a touch screen display for an electronic device. The average height of the textured features can be about equal to the average height of the plurality of discrete metal-containing dewetted islands before the oxidation step. The average longest lateral cross-sectional dimension of the textured features can be about equal to the average longest lateral cross-sectional dimension of the plurality of discrete metal-containing dewetted islands before the oxidation step. The area fraction of the substrate that is covered by the textured features can be about equal to the area fraction of the substrate that was covered by the plurality of discrete metal-containing dewetted islands before the oxidation step. The textured article can have an optical transmittance of at least about 93% and a haze of less than 5%. The amount of tactilely-transferable residue that is actually transferred from a user to the textured article can be less than or equal to about 0.8 mg per tactile contact or interaction. Finally, the contact angle between the textured article and water can be at least about 135°, and the contact angle between the textured article and oleic acid can be at least about 91°.

The various embodiments of the present disclosure are further illustrated by the following non-limiting examples.

EXAMPLES

Example 1

Fabrication of Masks by Dewetting of Ni and Cu CUTMF Stacks

In this example, CUTMFs consisting of two layer stacks were prepared on flat glass substrates and dewetted under reduced pressure to produce masks for use in texturing the glass substrates.

The substrates chosen were non-strengthened flat glass sheets having a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

The deposition of the CUTMFs was carried out using the sputtering system (ATC ORION-8-HV, AJA International) and procedures described in European Patent No. 2133921 A1 and European Patent Application No. 09382238.5, which are incorporated herein by reference as if fully set forth below. The as-deposited CUTMFs comprised a layer of Ni, having an average thickness of about 1 nm, disposed on one surface of the glass samples, and a layer of Cu, having an average thickness of about 6 nm deposited thereon.

After the CUTMFs were formed, the samples were thermally treated in a vacuum furnace (Thermo Scientific, VT 6060 P-500). This involved loading the samples into the furnace at room temperature, followed by first purging the furnace with Ar and then pumping down on the furnace until the pressure was reduced to about 0.01 mbar. At this pressure, the samples were heated to about 250° C. at a rate of about 8° C. to about 9° C. per minute. The samples were held at about 250° C. for about 10 minutes, and subsequently allowed to cool to room temperature. At this point, the pressure in the furnace was returned to ambient pressure, and the samples were removed from the furnace.

Figure 4A:
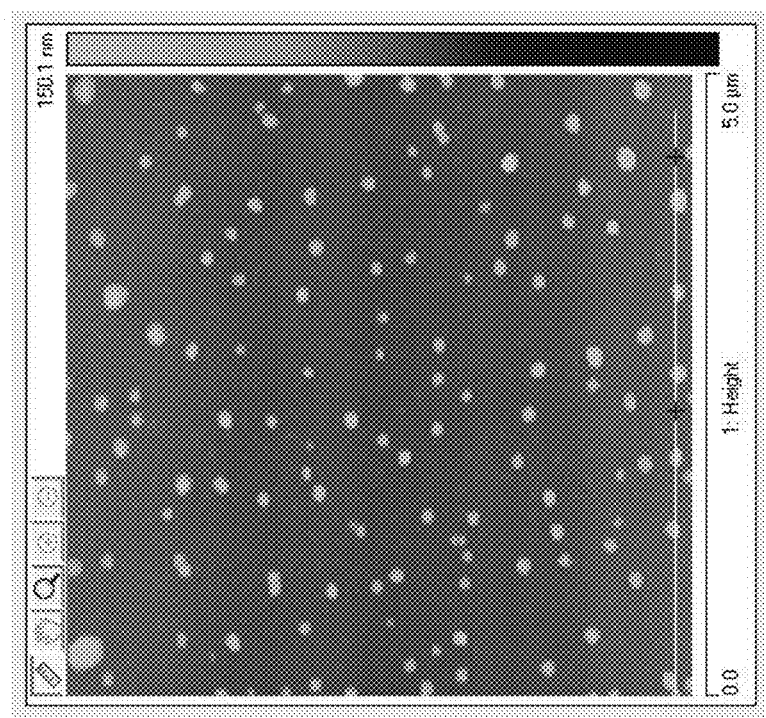
FIG. 4a is an atomic force microscope (AFM) image of a region of a surface of a dewetted sample in accordance with EXAMPLE 1.

FIG. 4a provides an AFM image of a region (having a size of about 5 micrometers by about 5 micrometers) of a surface of a representative sample dewetted in accordance with this example. As can be seen from the AFM image of FIG. 4a, the individual dewetted metal-containing islands in the sample window shown were all less than or equal to about 150 nm in height. In addition, the height profile for the line shown at the bottom of the AFM image of FIG. 4a is provided in FIG. 4b. As can be seen in the graph of FIG. 4b, the height of the islands along this line ranged from about 60 nm to about 95 nm, with an average height of about 70 nm to about 75 nm.

Figure 5:
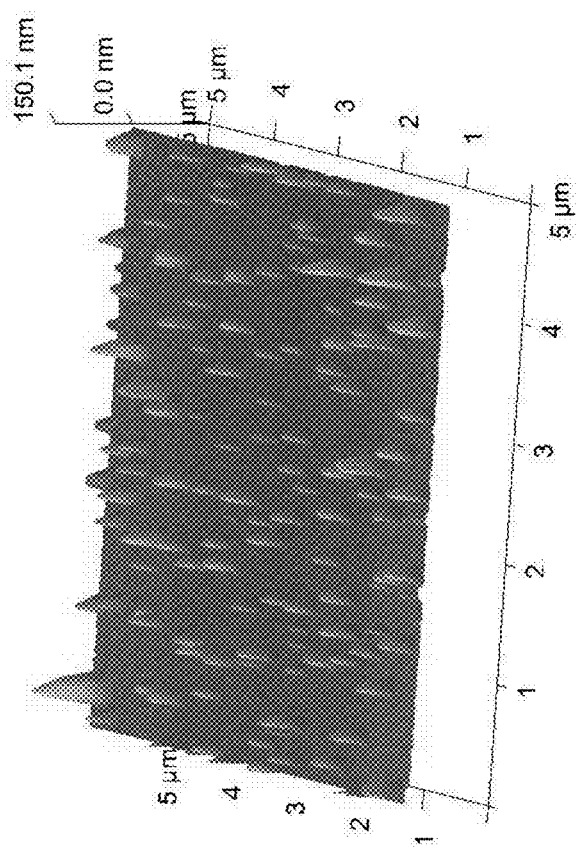
FIG. 5 is a three-dimensional AFM image of the region of the surface of the dewetted sample shown in FIG. 4a in accordance with EXAMPLE 1.

Similarly, FIG. 5 provides another AFM image of the same region of the surface of the sample. As can be seen from the AFM image of FIG. 5, the height distribution for the dewetted metal-containing islands was quite large. There was over a 100 nm window between the shortest and tallest metal-containing islands.

Figure 6:
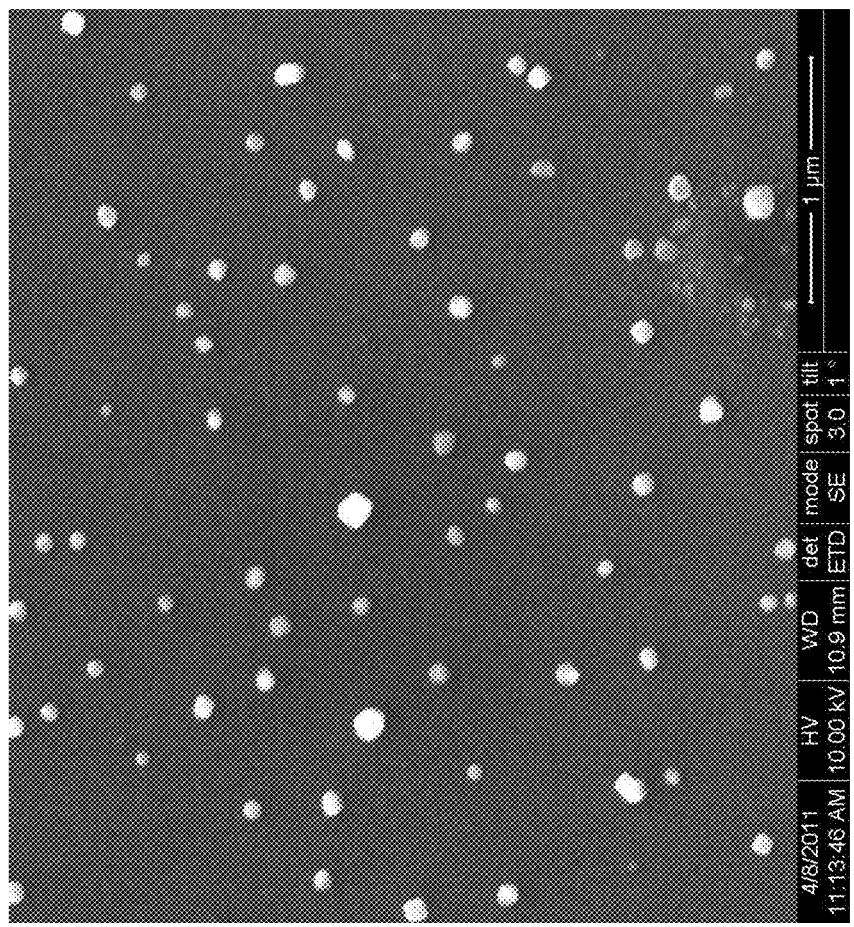
FIG. 6 is a scanning electron microscope (SEM) image of a region of a surface of a dewetted sample in accordance with EXAMPLE 1.

FIG. 6 provides an SEM image of a region of a surface of a representative sample dewetted in accordance with this example. SEM analysis was able to provide general information regarding the lateral cross-section of the dewetted metal-containing islands. As can be seen in the SEM image of FIG. 6, the individual dewetted metal-containing islands in the sample window shown had a lateral cross-section of less than or equal to about 150 nm.

Example 2

Fabrication of Masks by Dewetting of Single Layer Cu CUTMFs

In this example, CUTMFs, which were single layers of Cu, were prepared on glass substrates and dewetted under reduced pressure conditions to produce masks for use in texturing the glass substrates.

The substrates chosen were about 1 inch by about 1 inch squares of fused silica glass.

The deposition of the CUTMFs was carried out using the sputtering system (ATC ORION-8-HV, AJA International) and procedures described in European Patent No. 2133921 A1 and European Patent Application No. 09382238.5, which are incorporated herein by reference as if fully set forth below. The as-deposited Cu films had an average thickness of about 5 nm.

After the CUTMFs were formed, each sample was independently maintained in the sample holder of the sputtering system for the dewetting step. The samples were heated to about 450° C., at a rate of about 64° C. per minute. The samples were held at about 450° C. for about 20 minutes while $N_2$ was flowing in the sample chamber at a rate of about 20 standard cubic centimeters per minute (sccm). The samples were subsequently allowed to cool to about 50° C., at which point they were removed from the sample chamber. During the thermal treatment, the pressure in the sample chamber was about $0.6 \times 10^{-3}$ Torr.

Figure 7:
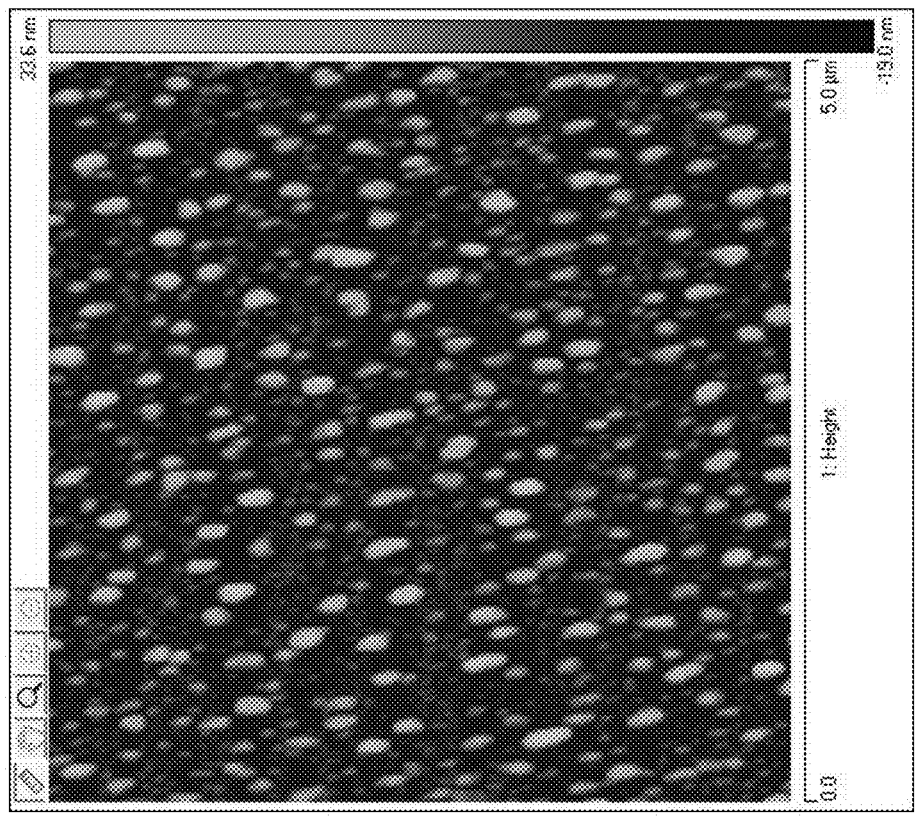
FIG. 7 is an AFM image of a region of a surface of a dewetted sample in accordance with EXAMPLE 2.

FIG. 7 provides an AFM image of a region (having a size of about 5 micrometers by about 5 micrometers) of a surface of a representative sample dewetted in accordance with this example. As can be seen from the AFM image of FIG. 7, the individual dewetted metal-containing islands in the sample window shown were all less than or equal to about 34 nm in height.

Example 3

Fabrication of Masks by Dewetting of Single Layer Cu CUTMFs

In this example, CUTMFs, which were single layers of Cu, were prepared on glass substrates and dewetted under ambient pressure conditions to produce masks for use in texturing the glass substrates.

The substrates chosen were about 2 inch by about 2 inch squares of non-strengthened flat glass sheets having a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

The deposition of the CUTMFs was carried out using an in-line DC magnetron sputtering system (KDF903i, KDF Electronics) and using the procedures described in European Patent No. 2133921 A1 and European Patent Application No. 09382238.5, which are incorporated herein by reference as if fully set forth below. Each glass substrate was cleaned prior to film deposition. During each deposition step, 12 substrate pieces were placed on a 12 inch by 12 inch carrier pallet. The as-deposited Cu films had an average thickness of about 6 nm.

After deposition, the adhesion of the CUTMFs was characterized in accordance with the so-called "adhesive tape test," defined in ASTM D3359-97, which is incorporated herein by reference as if fully set forth below. Each sample passed the adhesive tape test.

Each sample was then transferred to a rapid thermal annealing (RTA) furnace for dewetting. This involved loading the samples into the RTA furnace at room temperature, followed by first purging the furnace chamber with dry $N_2$ to eliminate the presence of $O_2$. Each sample was then heated in the $N_2$ atmosphere under ambient pressure to about 750° C. within about 30 seconds to about 60 seconds. The samples were held at about 750° C. for about 50 seconds to about 125 seconds, and subsequently allowed to cool to below about 150° C. At this point, the samples were removed from the RTA furnace.

Figure 8:
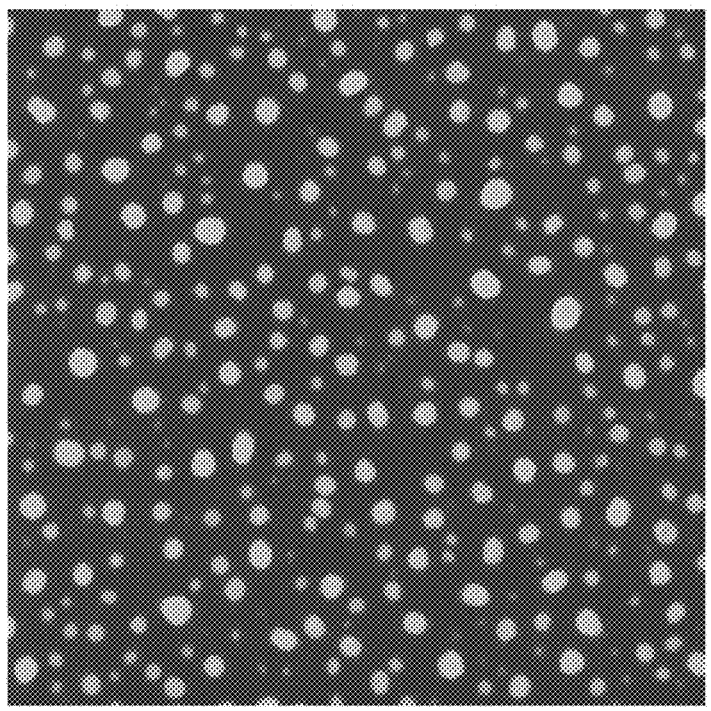
FIG. 8 is an AFM image of a region of a surface of a dewetted sample in accordance with EXAMPLE 3.

FIG. 8 provides an AFM image of a region (having a size of about 5 micrometers by about 5 micrometers) of a surface of a representative sample dewetted in accordance with this example.

Example 4

Fabrication of Masks by Dewetting of Single Layer Cu CUTMFs

In this example, CUTMFs, which were single layers of Cu, were prepared on glass substrates and dewetted under reduced pressure conditions to produce masks for use in texturing the glass substrates.

The substrates chosen were about 2 inch by about 2 inch squares of non-strengthened flat glass sheets having a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

The deposition of the CUTMFs was carried out using an in-line DC magnetron sputtering system (KDF903i, KDF Electronics) and using the procedures described in European Patent No. 2133921 A1 and European Patent Application No. 09382238.5, which are incorporated herein by reference as if fully set forth below. Each glass substrate was cleaned prior to film deposition. During each deposition step, 12 substrate pieces were placed on a 12 inch by 12 inch carrier pallet. The as-deposited Cu films had an average thickness of about 6 nm.

After deposition, the adhesion of the CUTMFs was characterized in accordance with the so-called "adhesive tape test," defined in ASTM D3359-97, which is incorporated herein by reference as if fully set forth below. Each sample passed the adhesive tape test.

The samples were then thermally treated in a vacuum furnace (Thermo Scientific, VT 6060 P-500). This involved loading the samples into the furnace at room temperature, followed by first purging the furnace with P10 gas (90% Ar and 10% $CH_4$) and then pumping down on the furnace until the pressure was reduced to about 4 mTorr. At this pressure, the samples were heated to about 450° C. at a rate of about 30° C. per minute. The samples were held at about 450° C. for about 5 minutes, and subsequently allowed to cool to room temperature. At this point, the pressure in the furnace was returned to ambient pressure, and the samples were removed from the furnace.

Figure 9:
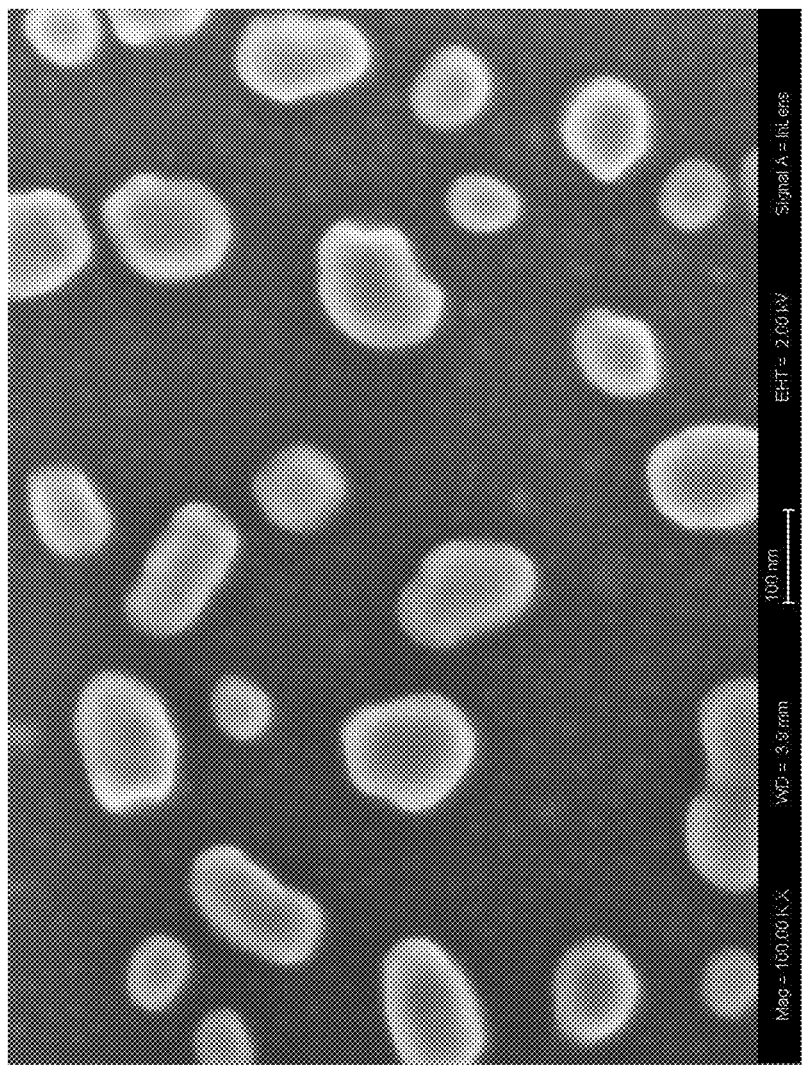
FIG. 9 is an SEM image of a region of a surface of a dewetted sample in accordance with EXAMPLE 4.

FIG. 9 provides an SEM image of a region (having a size of about 5 micrometers by about 5 micrometers) of a surface of a representative sample dewetted in accordance with this example. As can be seen in the SEM image of FIG. 9, the individual dewetted metal-containing islands in the sample window shown had a lateral cross-section of less than or equal to about 200 nm.

Example 5

Fabrication of Masks by Dewetting of Single Layer Ni, Cu, or Ag CUTMFs

In this example, CUTMFs, which were single layers of Ni, Cu or Ag, were prepared on glass substrates and dewetted under ambient pressure conditions to produce various masks for use in texturing the glass substrates.

The substrates chosen were about 1 inch by about 1 inch squares of fused silica glass.

The deposition of the CUTMFs was carried out using an in-line DC magnetron sputtering system (KDF903i, KDF Electronics) and using the procedures described in European Patent No. 2133921 A1 and European Patent Application No. 09382238.5, which are incorporated herein by reference as if fully set forth below. Each glass substrate was cleaned prior to film deposition. During each deposition step, 12 substrate pieces were placed on a 12 inch by 12 inch carrier pallet. The as-deposited metal films had an average thickness of about 15 nm.

After deposition, each sample was then transferred to a rapid thermal annealing (RTA) furnace for dewetting. This involved loading the samples into the RTA furnace at room temperature, followed by first purging the furnace chamber with dry $N_2$ to eliminate the presence of $O_2$. Each sample was then heated in the $N_2$ atmosphere under ambient pressure to about 750° C. within about 30 seconds to about 60 seconds. The samples were held at about 750° C. for about 55 seconds, and subsequently allowed to cool to below about 150° C. At this point, the samples were removed from the RTA furnace.

Figure 10B:
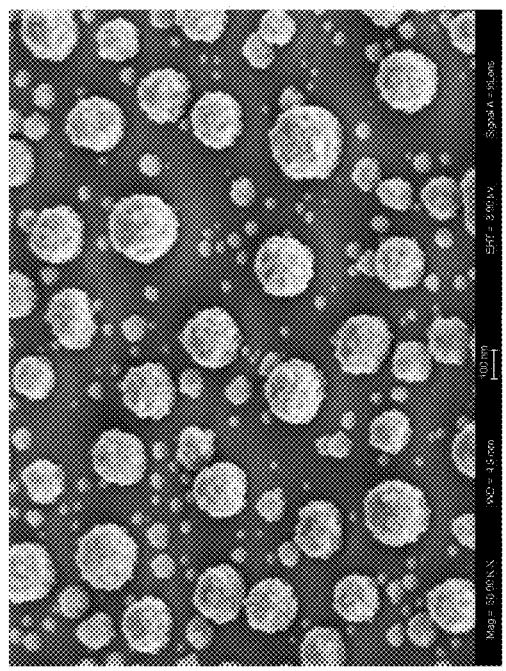
FIG. 10b is an SEM image of a region of a surface of a dewetted sample in accordance with EXAMPLE 5.
Figure 10A:
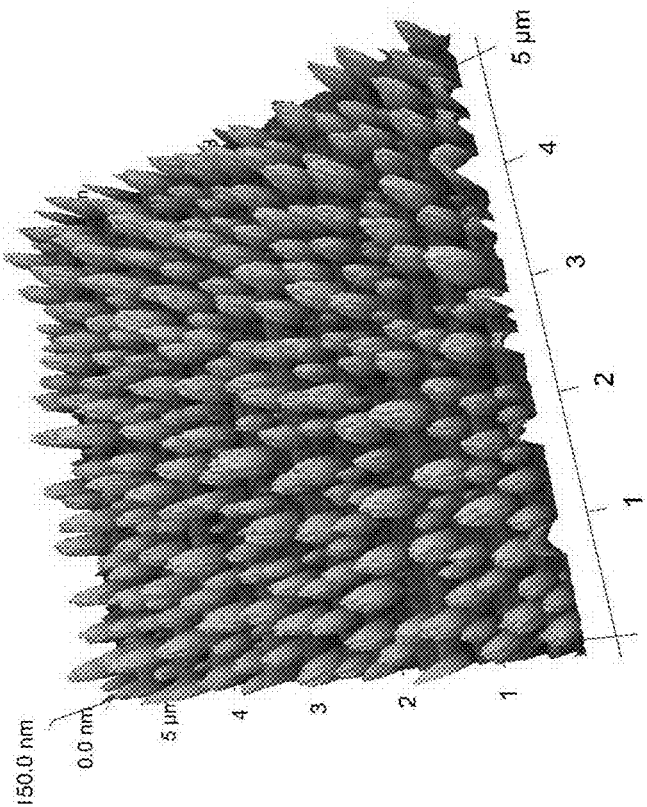
FIG. 10a is a three-dimensional AFM image of a region of a surface of a dewetted sample in accordance with EXAMPLE 5.

FIG. 10a provides an AFM image of a region (having a size of about 5 micrometers by about 5 micrometers) of a surface of a representative sample of a Cu CUTMF dewetted in accordance with this example. As can be seen from the AFM image of FIG. 10a, the individual dewetted Cu-containing islands in the sample window shown were all less than or equal to about 150 nm in height.

FIG. 10b provides an SEM image of a region of a surface of a representative sample of a Cu CUTMF dewetted in accordance with this example. As can be seen in the SEM image of FIG. 10b, the individual dewetted Cu-containing islands in the sample window shown had a lateral cross-section of less than or equal to about 200 nm.

Figure 11:
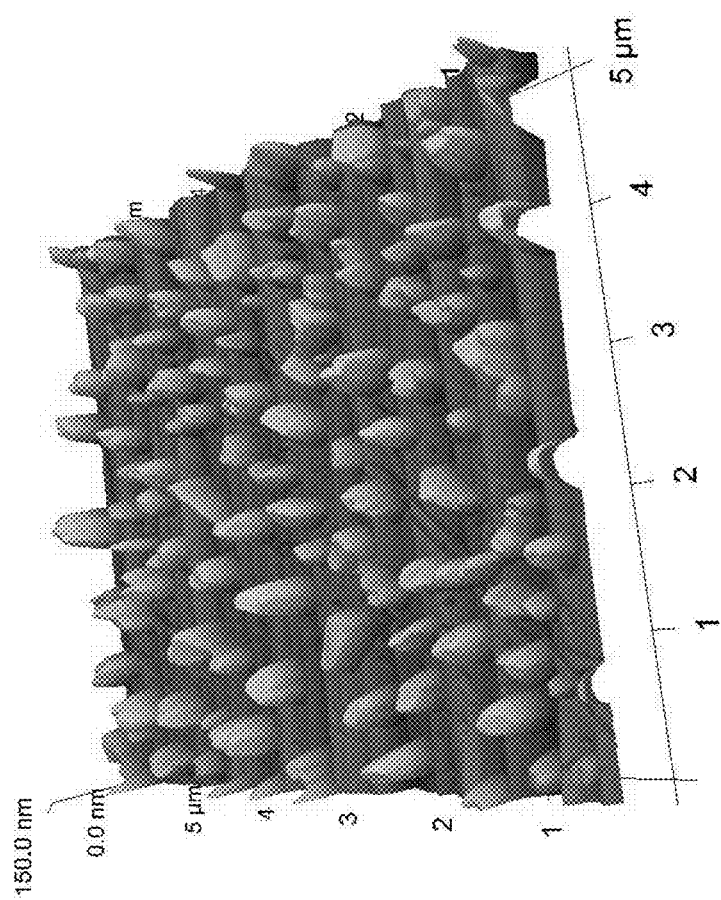
FIG. 11 is a three-dimensional AFM image of a region of a surface of a dewetted sample in accordance with EXAMPLE 5.

FIG. 11 provides an AFM image of a region (having a size of about 5 micrometers by about 5 micrometers) of a surface of a representative sample of a Ni CUTMF dewetted in accordance with this example. As can be seen from the AFM image of FIG. 11, the individual dewetted Ni-containing islands in the sample window shown were all less than or equal to about 150 nm in height.

Figure 12B:
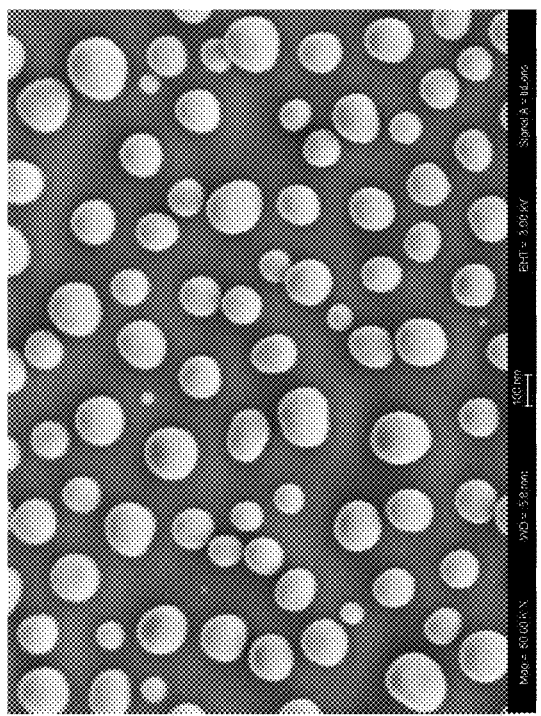
FIG. 12b is an SEM image of a region of a surface of a dewetted sample in accordance with EXAMPLE 5.
Figure 12A:
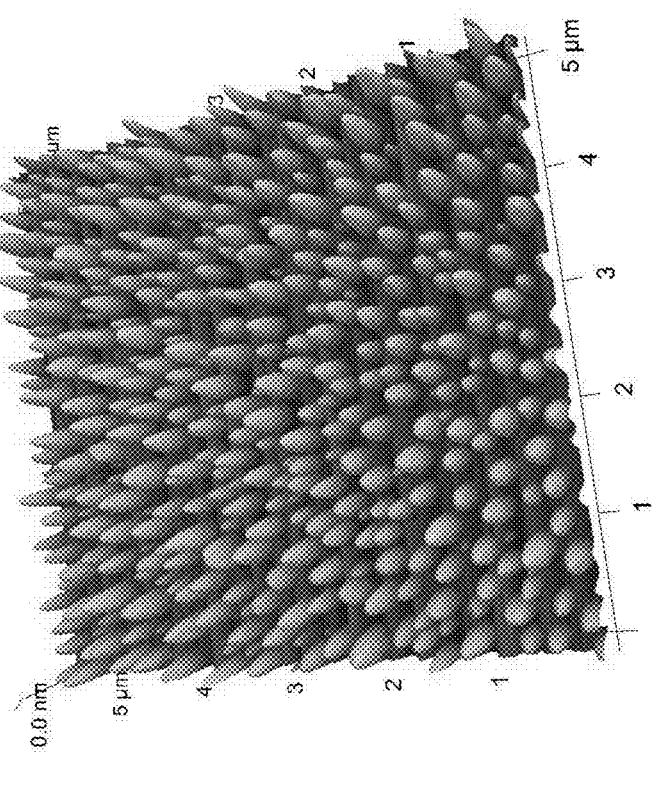
FIG. 12a is a three-dimensional AFM image of a region of a surface of a dewetted sample in accordance with EXAMPLE 5.

FIG. 12a provides an AFM image of a region (having a size of about 5 micrometers by about 5 micrometers) of a surface of a representative sample of a Ag CUTMF dewetted in accordance with this example. As can be seen from the AFM image of FIG. 12a, the individual dewetted Ag-containing islands in the sample window shown were all less than or equal to about 130 nm in height.

FIG. 12b provides an SEM image of a region of a surface of a representative sample of a Ag CUTMF dewetted in accordance with this example. As can be seen in the SEM image of FIG. 12b, the individual dewetted Ag-containing islands in the sample window shown had a lateral cross-section of less than or equal to about 200 nm.

Example 6

Effects on Mask Structure on Dewetting Time

In this example, the effects of dewetting time on the final mask structure were studied on CUTMFs, which were single layers of Cu, were prepared on glass substrates, and were dewetted under ambient pressure conditions.

The same procedure as described in EXAMPLE 3 above was carried out, with the exception that the as-deposited Cu films had an average thickness of about 10 nm.

Figure 13:
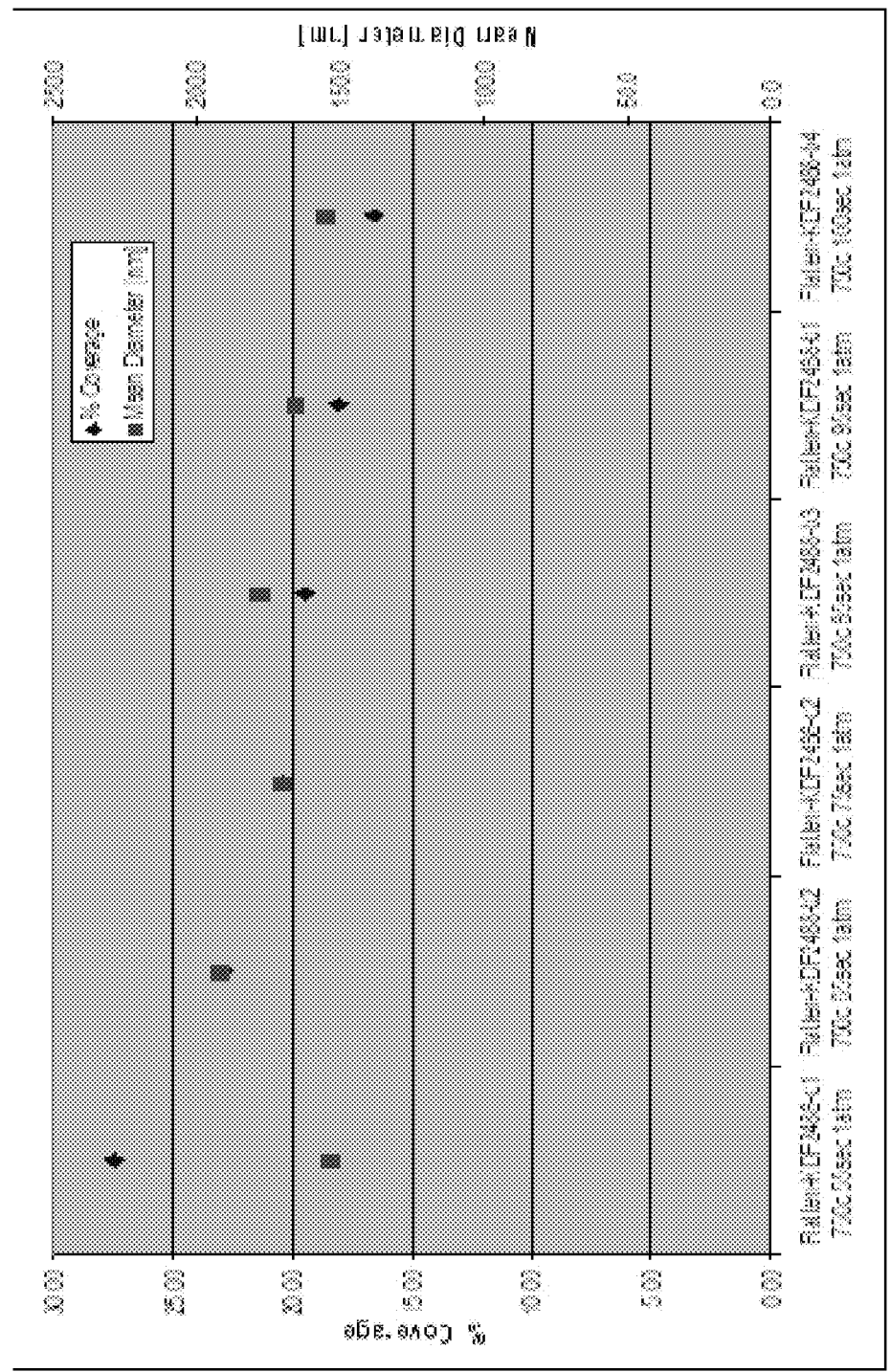
FIG. 13 is a graphical illustration of the average longest lateral cross-section and percent of surface covered by dewetted metal-containing islands as a function of dewetting time in accordance with EXAMPLE 6.

FIG. 13 graphically illustrates the average longest lateral cross-section and percent of surface covered by the dewetted Cu-containing islands as a function of dewetting time. FIG. 13 illustrates the data for dewetting times between about 55 seconds and about 100 seconds. As can be seen from the graph of FIG. 13, the area (expressed as a percentage) of the surface of the substrate that was covered by the dewetted Cu-containing islands is less than or equal to about 27.5% after about 55 seconds of dewetting at about 750° C. in the RTA furnace. This amount was reduced, substantially linearly, to about 17% after about 100 seconds of dewetting at about 750° C. in the RTA furnace. Similarly, the average longest lateral cross-section of the Cu-containing islands varied non-linearly with dewetting time between 150 nm and about 200 nm.

Example 7

Texturing Glass Surfaces by Dry Etching

In this example, a masked glass surface was dry etched using a reactive ion etching (RIE) process to produce a textured glass article.

A masked glass surface produce in accordance with EXAMPLE 3 above was placed in a RIE chamber (Plasmalab System 100 ICP180, Oxford Instruments) equipped with a 4 inch diameter clamping plate. The RIE parameters are shown in Table 1 below. After the RIE process, the mask was removed.

TABLE 1

| | |
|---|---|
| Time (min.) | 6.5 |
| Gas 1 (sccm) | Ar (40) |
| Gas2 (sccm) | CHF3 (5) |
| Power (W) | 300 |
| Voltage (V) | |
| Temperature (° C.) | 10 |
| Pressure (mTorr) | 10 |

The RIE process had a marked sputtering character. As a result, shapes obtained had a very high reproducibility, and there was a linear relationship between time and etching depth.

Figure 14B:
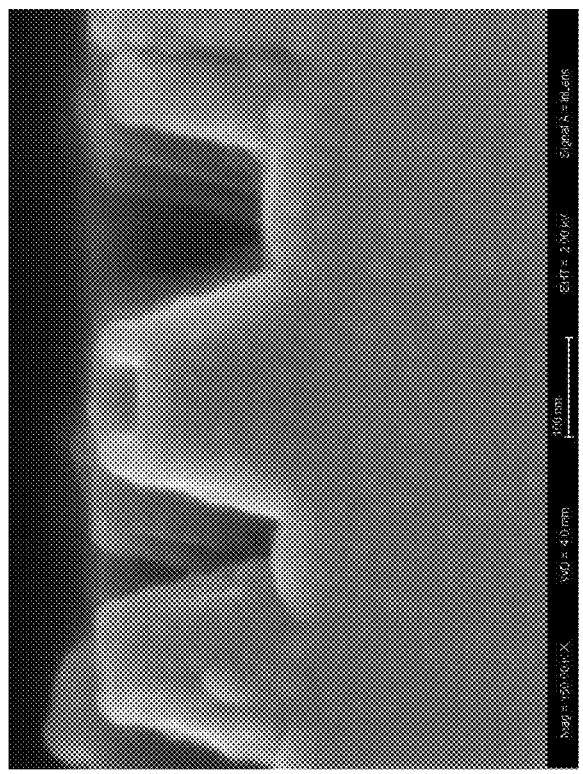
FIG. 14b is an SEM image of a perspective view of a region of a surface of a representative textured sample in accordance with EXAMPLE 7.
Figure 14A:
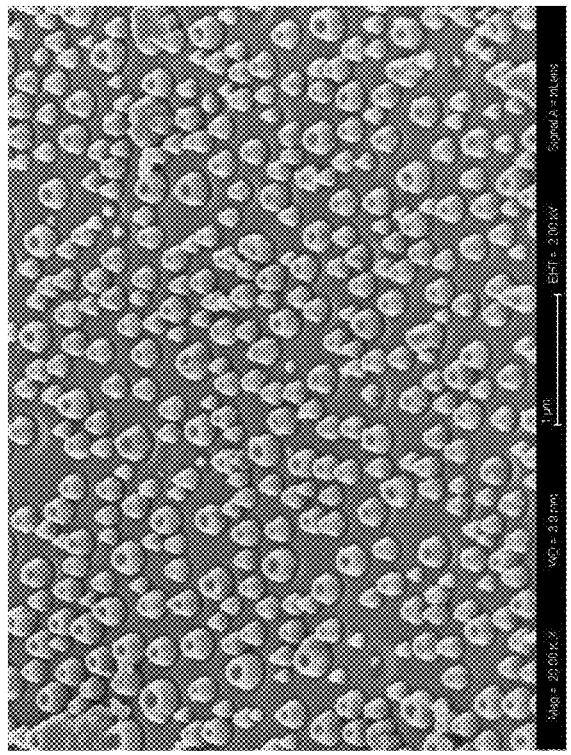
FIG. 14a is an SEM image of a perspective view of a region of a surface of a representative textured sample in accordance with EXAMPLE 7.

FIGS. 14*a-b* provide SEM images of perspective views of regions of surfaces of representative RIE-textured samples in accordance with this example. As can be seen in the SEM images of FIGS. 14*a-b*, the individual textured features in the sample window shown had a tapered shape and generally had an average longest lateral cross-section of less than or equal to about 250 nm. In addition, the individual textured features were mortise-topped protrusions.

Example 8

Texturing Glass Surfaces by Dry Etching

In this example, a masked glass surface was dry etched using a reactive ion etching (RIE) process to produce a textured glass article.

A masked glass surface produce in accordance with EXAMPLE 3 above was placed in a RIE chamber (Plasmalab System 100 ICP180, Oxford Instruments) equipped with a 4 inch diameter clamping plate. The RIE parameters are shown in Table 2 below. After the RIE process, the mask was removed.

TABLE 2

| Time (min.) | 8 |
|---|---|
| Gas 1 (sccm) | O2 (7) |
| Gas2 (sccm) | SF6 (72) |
| Power (W) | 150 |
| Voltage (V) | 300 |
| Temperature (° C.) | 50 |
| Pressure (mTorr) | 65 |

This RIE process was more balanced in character, being somewhat between a sputtering etch and chemical reaction etch. As a result, the textured shapes or protrusions obtained had an undercut or reentrant geometry with rounded sidewalls, and a single mortise in each protrusion. This RIE process did not exhibit a linear relationship between time and etching depth.

Figure 15A:
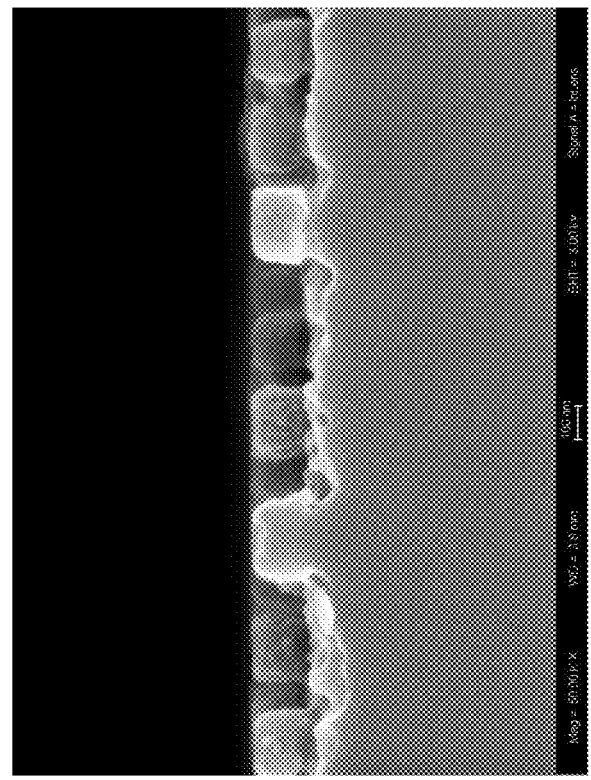
FIG. 15a is an SEM image of a perspective view of a region of a surface of a representative textured sample in accordance with EXAMPLE 8.
Figure 15B:
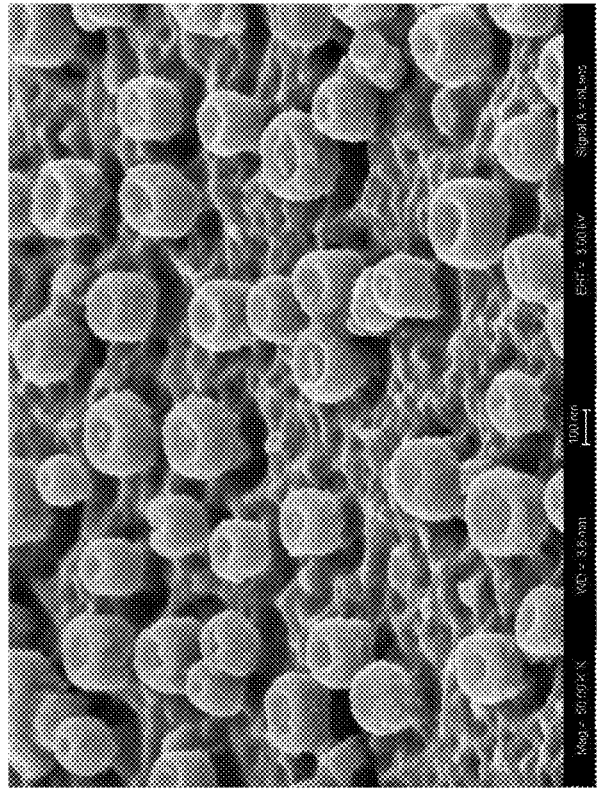
FIG. 15b is an SEM image of a cross section of region of a surface of a representative RIE-textured sample in accordance with EXAMPLE 8.

FIG. 15*a* provides an SEM image of a perspective view of a region of a surface of a representative RIE-textured sample in accordance with this example. In contrast, FIG. 15*b* provides an SEM image of a cross section of region of a surface of a representative RIE-textured sample in accordance with this example. As can be seen in the SEM images of FIGS. 15*a-b*, the individual mortise-topped protrusions in the sample window shown had rounded sidewalls and a mushroom-like shape. The average longest lateral cross-section of the mortise-topped protrusions was generally less than or equal to about 250 nm.

Example 9

Texturing Glass Surfaces by Dry Etching

In this example, a masked glass surface was dry etched using a reactive ion etching (RIE) process to produce a textured glass article.

The same procedure as described in EXAMPLE 5 above was carried out, with the exception that the as-deposited Ni films had an average thickness of about 6 nm. Such a masked glass surface was placed in a RIE chamber (Plasmalab System 100 ICP180, Oxford Instruments) equipped with a 4 inch diameter clamping plate. The RIE parameters are shown in Table 3 below. After the RIE process, the mask was removed.

TABLE 3

| Time (min.) | 7 |
|---|---|
| Gas 1 (sccm) | SF6 (29) |
| Power (W) | 200 |
| Voltage (V) | 450 |
| Temperature (° C.) | 20 |
| Pressure (mTorr) | 45 |

This RIE process was primarily a chemical reaction etch. As a result, the textured shapes obtained were columnar to slightly-tapered.

Figure 16B:
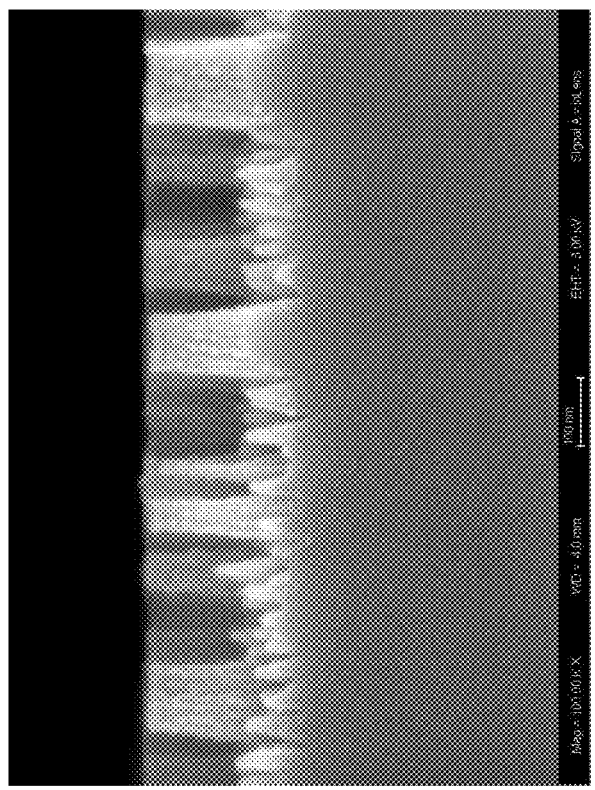
FIG. 16b is an SEM image of a cross section of region of a surface of a representative RIE-textured sample in accordance with EXAMPLE 9.
Figure 16A:
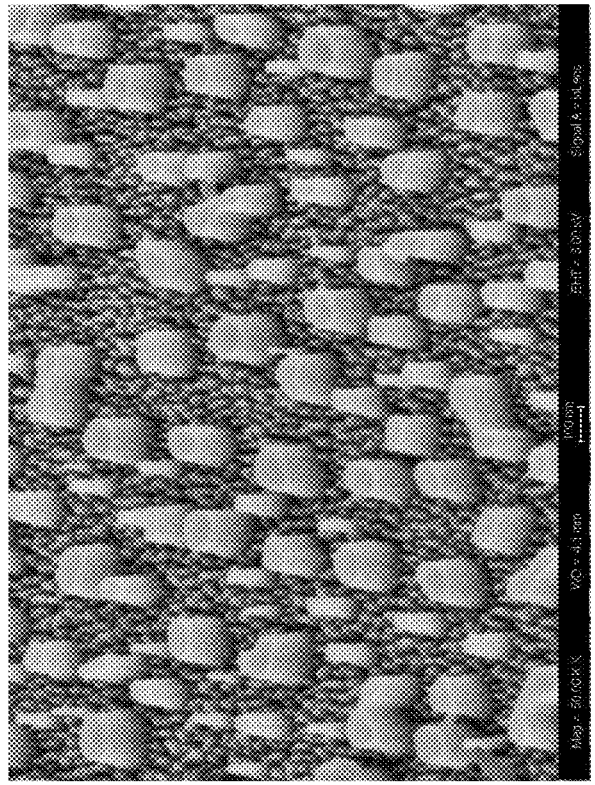
FIG. 16a is an SEM image of a perspective view of a region of a surface of a representative textured sample in accordance with EXAMPLE 9.

FIG. 16*a* provides an SEM image of a perspective view of a region of a surface of a representative RIE-textured sample in accordance with this example. In contrast, FIG. 16*b* provides an SEM image of a cross section of region of a surface of a representative RIE-textured sample in accordance with this example. As can be seen in the SEM images of FIGS. 16*a-b*, the individual textured features in the sample window shown were columnar and generally had an average longest lateral cross-section of less than or equal to about 100 nm.

While the embodiments disclosed herein have been set forth for the purpose of illustration, the foregoing description should not be deemed to be a limitation on the scope of the disclosure or the appended claims. Accordingly, various modifications, adaptations, and alternatives may occur to one skilled in the art without departing from the spirit and scope of the present disclosure or the appended claims.

What is claimed is:

1. A textured article, comprising:
a substrate; and
a plurality of mortise-topped protrusions on a surface of the substrate;
wherein the mortise-topped protrusions have an average height of about 5 nanometers to about 300 nanometers, an average longest lateral cross-sectional dimension of about 10 nanometers to about 1000 nanometers, and are randomly oriented on the surface of the substrate,
wherein the plurality of mortise-topped protrusions comprise a mortise having an average depth less than or equal to about 75 percent of the average height of the mortise-topped protrusions, and
wherein an optical transmittance of the textured article is greater than or equal to about 94 percent over a visible spectrum of light.

2. The textured article of claim 1, wherein the mortise comprises an average longest lateral cross-sectional dimension less than or equal to about 95 percent of a longest cross-sectional dimension of a top surface of the mortise-topped protrusions.

3. The textured article of claim 2, wherein the mortise-topped protrusions comprise only a single mortise.

4. The textured article of claim 1, wherein the mortise-topped protrusions have an average height of about 50 nanometers to about 300 nanometers, have an average longest lateral cross-sectional dimension of about 10 nanometers to about 300 nanometers, and are randomly oriented on the surface of the substrate so as to cover about 0.1 to about 0.25 of an area fraction of the surface of the substrate.

5. The textured article of claim 4, wherein the mortise comprises an average longest lateral cross-sectional dimension of about 40 percent to about 80 percent of a longest cross-sectional dimension of a top surface of the mortise-topped protrusions and an average depth of about 5 percent to about 60 percent of the average height of the mortise-topped protrusions.

6. The textured article of claim 5, wherein the mortise-topped protrusions comprise only a single mortise.

7. The textured article of claim 1, wherein a haze of the textured article is less than or equal to about 5 percent.

8. The textured article of claim 1, wherein a contact angle between the substrate and water is greater than or equal to about 135 degrees, and wherein a contact angle between the substrate and oleic acid is greater than or equal to about 92 degrees.

9. The textured article of claim 1, wherein an amount of tactilely-transferable residue that is transferred to the textured article is less than or equal to about 1 milligram per tactile contact.

10. The textured article of claim 1, wherein the textured article is at least a portion of a touch-sensitive display screen or cover plate for an electronic device, a non-touch-sensitive component of an electronic device, a surface of a household appliance, or a surface of a vehicle component.

11. The textured article of claim 1, wherein the randomly oriented plurality of mortise-topped protrusions cover less than or equal to about 0.5 of an area fraction of the surface of the substrate and have an average longest lateral cross-sectional dimension of about 10 nanometers to about 500 nanometers.

12. A textured article, comprising
a strengthened alkali aluminosilicate glass substrate having an average thickness of about 0.02 millimeters to about 2.0 millimeters, and comprising a plurality of mortise-topped protrusions on a surface;
wherein the plurality of mortise-topped protrusions have an average height of less than or equal to about 200 nanometers, an average longest lateral cross-sectional dimension of less than or equal to about 150 nanometers, and are randomly oriented on the surface of the strengthened alkali aluminosilicate glass substrate
wherein the plurality of mortise-topped protrusions comprise a mortise having an average depth less than or equal to about 75 percent of the average height of the mortise-topped protrusions, and
wherein an optical transmittance of the textured article is greater than or equal to about 94 percent over a visible spectrum of light.

13. The textured article of claim 12, wherein a haze of the textured article is less than or equal to about 3 percent.

14. The textured article of claim 12, wherein a contact angle between the textured strengthened alkali aluminosilicate glass substrate and water is greater than or equal to about 140 degrees, and wherein a contact angle between the textured strengthened alkali aluminosilicate glass substrate and oleic acid is greater than or equal to about 93 degrees.

15. The textured article of claim 12, wherein an amount of tactilely-transferable residue that is transferred to the textured article is less than or equal to about 0.5 milligrams per tactile contact.

16. A method of forming the textured article of claim 1, the method comprising:
disposing a mask comprising nanostructured metal-containing features on a surface of a substrate; and
dry etching at least portions of the surface of the substrate on which the mask is not disposed to produce a plurality of mortise-topped protrusions on the surface of the substrate.

17. The method of claim 16, wherein disposing the mask having nanostructured metal-containing features on the surface of the substrate comprises:
providing the substrate comprising a continuous ultra-thin metal-containing film or film stack disposed on the surface of the substrate; and
dewetting at least a portion of the continuous ultra-thin metal-containing film or film stack to produce a plurality of discrete metal-containing dewetted islands on the surface of the substrate.

18. The method of claim 16, further comprising removing the nanostructured metal-containing features from the surface of the substrate after the dry etching.

19. The method of claim 16, further comprising repeating the dry etching of the portions of the surface of the substrate on which the mask is not disposed to produce additional textured features having topological features distinct from the mortise-topped protrusions.

* * * * *